United States Patent [19]

Tachikawa et al.

[11] Patent Number: 5,414,548
[45] Date of Patent: May 9, 1995

[54] ARRAYED-WAVE GUIDE GRATING MULTI/DEMULTIPLEXER WITH LOOP-BACK OPTICAL PATHS

[75] Inventors: Yoshiaki Tachikawa; Masao Kawachi, both of Mito; Hiroshi Takahashi, Yokosuka; Kyo Inoue, Yokohama, all of Japan

[73] Assignee: Nippon Telegraph and Telephone Corporation, Tokyo, Japan

[21] Appl. No.: 127,879

[22] Filed: Sep. 28, 1993

[30] Foreign Application Priority Data

Sep. 29, 1992 [JP] Japan .................. 4-260222
May 26, 1993 [JP] Japan .................. 5-124488

[51] Int. Cl.$^6$ ................... G02B 6/26; H04J 14/00
[52] U.S. Cl. ....................... 359/130; 359/115; 359/116; 359/124; 385/24; 385/14; 385/15; 385/37
[58] Field of Search ............... 359/166, 173, 124, 127, 359/130, 115, 116; 385/24, 14, 15, 37

[56] References Cited

U.S. PATENT DOCUMENTS

| | | | |
|---|---|---|---|
| 3,740,560 | 6/1973 | Wentz | 359/156 |
| 4,166,212 | 8/1979 | Judeinstein | 359/186 |
| 4,468,766 | 8/1984 | Spezio | 359/130 |
| 4,511,207 | 4/1985 | Newton et al. | 385/24 |
| 4,653,042 | 3/1987 | d'Auria et al. | 359/124 |
| 4,671,605 | 6/1987 | Soref | 350/96.15 |
| 4,715,027 | 12/1987 | Mahapatra et al. | 359/130 |
| 4,746,186 | 5/1988 | Nicia | 359/124 |
| 4,890,893 | 1/1990 | Smoot | 350/96.15 |
| 4,950,045 | 8/1990 | Bricheno et al. | 385/24 |
| 5,002,350 | 3/1991 | Dragone | 359/124 |
| 5,024,502 | 6/1991 | Maisonneuve et al. | 359/173 |
| 5,031,235 | 7/1991 | Raskin et al. | 359/173 |
| 5,060,301 | 10/1991 | Nishimura | 359/156 |
| 5,064,263 | 11/1991 | Stein | 385/24 |
| 5,101,455 | 3/1992 | Goutzoulis | 359/173 |
| 5,136,671 | 8/1992 | Dragone | 385/46 |

OTHER PUBLICATIONS

Patent Abstracts of Japan, vol. 13, No. 200 (P-869), May 12, 1989 & JP-A-01 020 506.

Primary Examiner—Hezron E. Williams
Assistant Examiner—Richard A. Moller
Attorney, Agent, or Firm—Finnegan, Henderson, Farabow, Garrett & Dunner

[57] ABSTRACT

An optical device is presented which is useful for optical signal transmission and switching systems by multiplexing and demultiplexing optical signals in looped optical paths, consisting of a plurality of individual loop-back optical paths. The device is essentially a multi/demultiplexer having an arrayed waveguide grating disposed between a plurality of input sections and output sections which are joined by the plurality of individual loop-back optical paths. Because the modulated signals are looped back into the same optical paths using the same devices, problems of mismatching performance introduced by using different optical devices are avoided. The device processes individual optical signals of different wavelengths, minimizes splitting losses, and reduces noise components by producing narrow bandpass signals of high signal to noise ratio. Optical signal splitting and insertion, delay line memory and delay equalization circuits can all be handled by the same circuit configuration. The device is simple in construction, reliable in performance and economical in production.

33 Claims, 17 Drawing Sheets

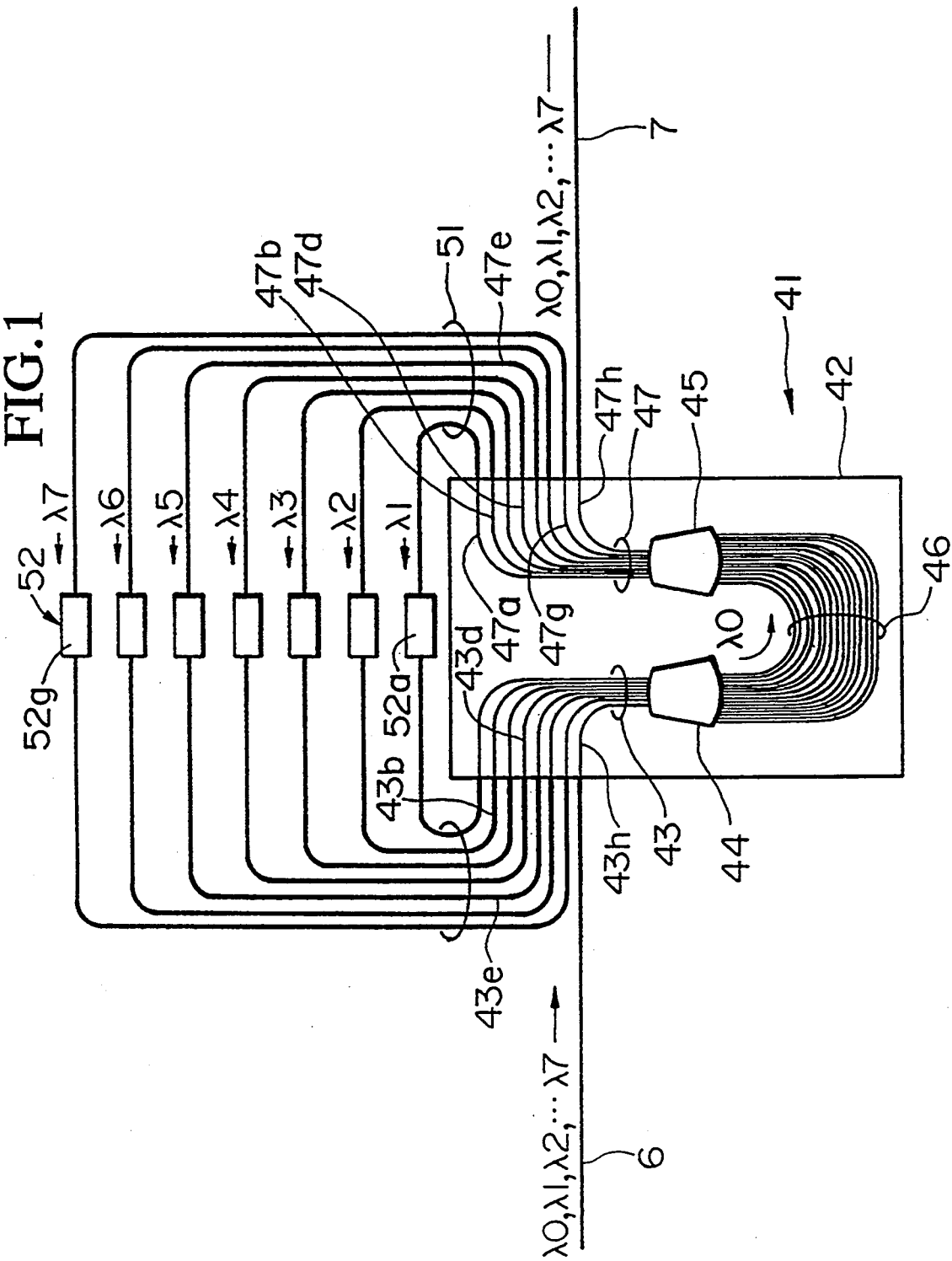

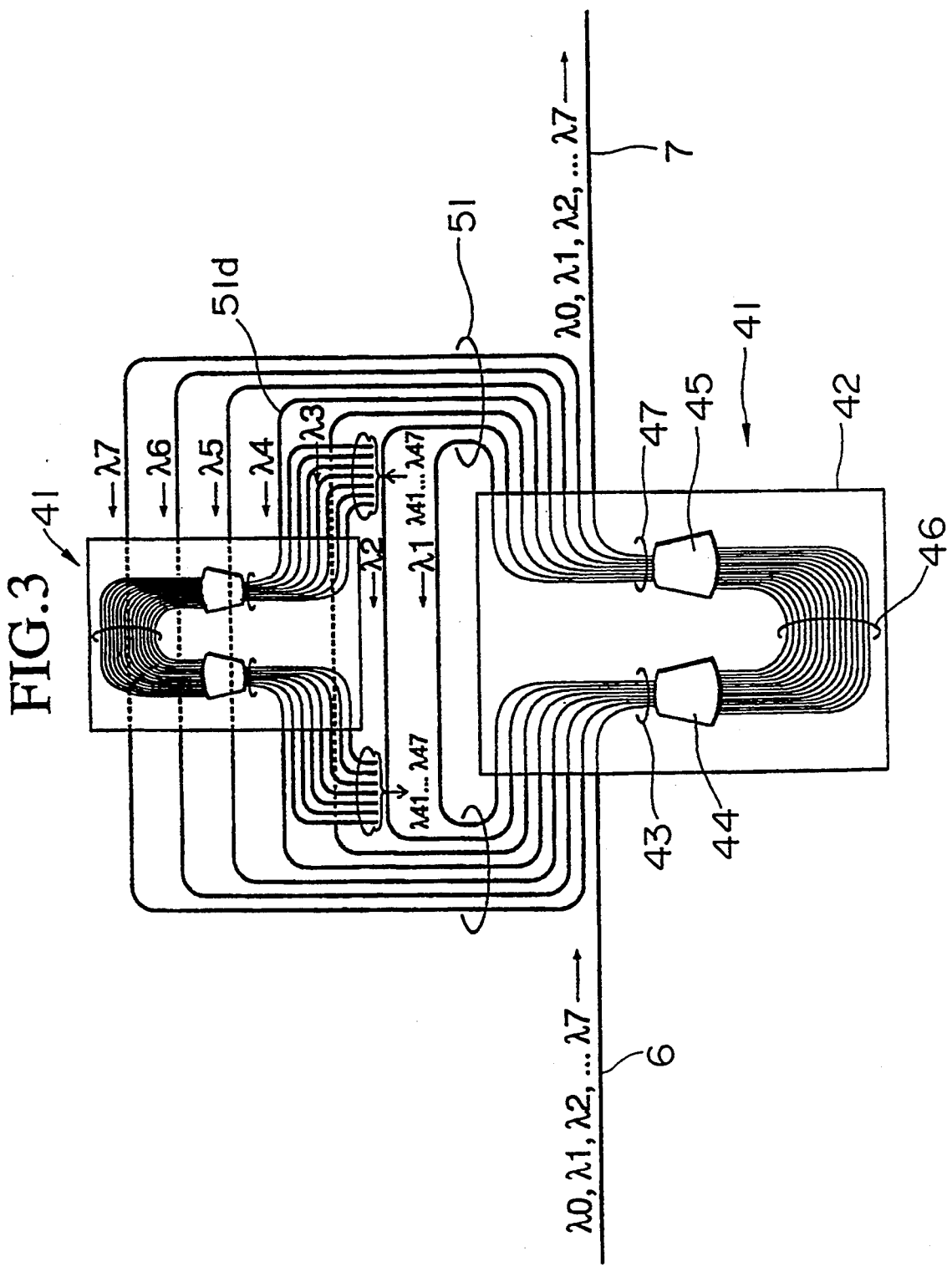

ARRAYED-WAVE GUIDE GRATING MULTI/DEMULTIPLEXER WITH LOOP-BACK OPTICAL PATHS

BACKGROUND OF THE INVENTION

1. Field of the Invention

The present invention relates to an optical multi/demultiplexer device with loop-back optical paths having an arrayed waveguide grating, applicable to optical communication systems and optical switching systems. The device is simple in construction, and can be fabricated with high yield.

2. Technical Background

Conventionally, an optical add-drop multiplexer (referred to as ADM) such as the one shown in FIG. 19 is known as a key device for use in splitting and inserting wavelength-multiplexed optical signals. The ADM 1 comprises a demultiplexer 2, a multiplexer 3, and N lines of optical fibers 4a, 4b, ... 4n.

In the optical ADM 1 circuit, multiplexed input optical signals consisting of wavelengths λ1, λ2, ..., λn are separated into optical signals of N wavelengths from which desired optical signals, for example, λi and λj, are outputted. The remaining optical signals are transmitted through the optical fibers 4a, 4b, ... 4n, which are multiplexed with the external signals λi, λj, and are outputted as multiplexed optical signals λ1, λ2, ..., λn.

Another conventional ADM is shown in FIG. 20.

This ADM 5 is disposed between two optical transmission lines 6, 7, and comprises a demultiplexer 11, a multiplexer 12, 7 lines of optical fibers 13a, 13b, ... 13g and a signal processing device 14 provided for each of the optical fibers 13a to 13g. In this case, seven wavelengths are shown for brevity, although in general, any number of wavelengths can be multiplexed.

In the above ADM 5, the multiplexed input optical signal of wavelengths λ1, λ2, ..., λ7 is first separated into optical signals of seven wavelengths by the demultiplexer 11, and then these optical signals are transmitted by the corresponding optical fibers 13a to 13g. The separated optical signals are processed by each of the signal processing device 14, are converted into electrical signals and are outputted from the ADM 5 to transmit the information forward. The response to the forwarded information or to a new piece of information is converted into an optical signal by the same signal processing device 14, and is inputted into a corresponding optical fiber 13. The optical signals transmitted through the optical fibers 13a to 13g are multiplexed by the multiplexer 12, and are outputted as multiplexed optical signals of wavelengths λ1, λ2, ..., λ7, and are forwarded to the optical line 7.

Further in this ADM 5, signal processing is carried out on all the wavelengths, but in general it is irregular to process all the signals. In such a case, for the wavelengths which need not be processed, only the optical fibers 13 are needed, and signal processing devices 14 can be omitted.

Also, there is known an optical delay line memory which delays pulsed optical signals and stores delayed optical pulses.

The optical delay line memory is classified into two large categories depending on the operational mode, into a tap type, represented typically by a parallel distribution type; and a loop type represented typically by a looping delay type.

FIG. 21 schematically illustrate the parallel distribution type optical delay line memory.

This optical delay line memory 21 comprises: a fixed wavelength light source 22; a 1×N optical coupler 23 which divides the optical pulses from the light source 22 into N optical paths; a plurality of delay fibers 24a, 24b, ..., 24n which provide delay times iτ (i=1, 2, ..., N); an N×1 optical switch 25 which selects one pulse of the delayed optical pulses given a delay of iτ; and an optical detector 26 which converts the optical pulses into electrical signals.

This optical delay line memory 21 has an advantage that the variations in the optical losses in a plurality of transmission lines are low.

FIG. 22, is a schematic illustration of the looping type delay line memory.

The optical delay line memory 31 comprises: a fixed wavelength light source 22; a 2×2 optical coupler 32; a delay line optical fiber 33 which constitutes a loop for propagating the signal; an optical amplifier 34; an optical switch 35; and an optical detector 26.

In the above optical delay line memory 31, the optical pulses forwarded from the fixed wavelength light source 22 are inputted into the loop containing the delay line optical fiber 33 through a 2×2 optical coupler 32. In this loop, when a pulse signal loops around i times around the loop, the delay time is given by iτ (where i=1, 2, ..., N). The optical pulses having been delayed by the desired time duration, pass through the optical switch 35 by the gating action of the optical switch 35, and are converted into electrical signals by the optical detector 26. In this case, the intensity of the input optical pulses to the 2×2 optical coupler 32 decreases in principle by $\frac{1}{4}$ every time the pulse loops through the coupler 32; therefore, when the pluses loop around N times, the intensity decreases to $\frac{1}{2}^{(N+1)}$. An optical amplifier 34 is used to compensate for the loss in intensity.

The advantage of the optical delay line memory 31 is that the scale of the hardwares for propagating the signal around the loop is small.

In the meantime, an optical multi/demultiplexer having an arrayed waveguide grating type, shown in FIG. 23 has been proposed.

This optical multi/demultiplexer (referred to as a multi/demultiplexer hereinbelow) 41 is provided with N input waveguides 43, slab waveguides 44, 45 of depressed surface type, arrayed waveguide grating 46 and N lines of output waveguides 47, all of which are mounted on a substrate 42. Multiplexed input signals, of wavelengths constituted by λ1, λ2, ..., λn, inputted into the input waveguide 43 are separated into N signals of wavelength λi and output them from the corresponding output waveguides 47j (j=a, b, ..., n).

In the above ADM 1, both a demultiplexer 2 and a multiplexer 3 are used as a pair, therefore, it is necessary to precisely match the device characteristics of the demultiplexer 2 and the multiplexer 3. However, in practice, it is extremely difficult to manufacture such identically-matched devices, and their yield has been very poor. This was one of the reasons for a high cost of such optical devices.

In the other type of ADM 5 also, as in the above-mentioned ADM 1, it is necessary that the operating characteristics of the demultiplexer 11 and the multiplexer 12 be matched precisely. Therefore, such a system has a disadvantage that a paired device must be selected carefully from a production lot, thus leading to low production yield. The configuration of the ADM 5 also has a problem that it tended to be too large.

Also, because the above mentioned optical delay line memory 21 uses a 1×N optical coupler 23 and an N×1 optical switch 25, it is mandatory to have optical couplers and optical switches of uniform optical intensity loss and optical division ratio, thus leading to one major disadvantage that the number of the operating component parts required increases, and the number of steps in the joining operation increases. It follows, therefore, that the number of optical parts for making the system also increases, and the economics of the system suffers.

Further, as the number of division (N) increases, it becomes difficult, in particular, to fabricate N×1 optical switches 25 for varying the magnitude of optical delay times.

Further, in the above optical delay line memory 31, it is not possible to make a loop gain of 1, thus leading to the basic deficiency that the optical intensity loss increases as the optical pulses are propagated around the loop, and that the spontaneous emission noise accumulates leading to a degradation in the S/N ratio.

Further, in the above multi/demultiplexer 41 of the arrayed waveguide grating type, multiplexed optical signals consisting of $\lambda 1, \lambda 2, \ldots, \lambda n$ are separated into N pieces of optical signals $\lambda i$, and are outputted from the corresponding output waveguide 47j. However, there are many unused input waveguides 43 and output waveguides 47, and the utilization factor is low, thus wasting the vast multiplexing capabilities of this optical device.

SUMMARY OF THE INVENTION

The present invention was made in view of the background of the technology presented above, and the main object is to present an optical multi/demultiplexer device, of a simple construction and stable performance, having an arrayed waveguide grating with loop-back optical paths. Hereinbelow, the optical multi/demultiplexer device is referred to as the arrayed waveguide grating multi/demultiplexer (abbreviated as AWGMD) with loop-back optical paths.

The arrayed waveguide grating multi/demultiplexer with loop-back optical paths is provided with a common arrayed waveguide grating shared between a plurality of input sections and a plurality of output sections. A part of the optical signals from the output sections is inputted and looped through the corresponding input section of the plurality of input sections to generate output optical signals containing optical information. Therefore, the performance of the optical device of the present invention is superior to that of using several conventional multiplexers and demultiplexers of matched performance characteristics.

The optical device of the present invention is an arrayed waveguide grating multi/demultiplexer for generating optical information from optical signals inputted into the device, the device comprising: (a) a plurality of input sections for receiving optical signals consisting of a plurality of wavelengths, (b) a plurality of output sections for outputting optical information; (c) a plurality of loop-back optical paths means disposed between the plurality of input sections and the plurality of output sections for generating looping optical signals from the output section, and inputting the looping optical signals into corresponding ones of the input section so as to generate optical information.

In the optical device of the above configuration, because demultiplexing and multiplexing operations are performed by the same multi/demultiplexer device, the wavelength characteristics of the demultiplexer and the multiplexer are perfectly matched. The optical signals are passed through the same devices several times, and the output signals thus become narrowband. The device production yield is therefore improved. Further, each wavelength of the wavelength-multiplexed signals can be processed separately while minimizing splitting losses, therefore, the optical band width of the optical signals becomes narrowband, and it becomes possible to decrease the undesired noise components of the optical signal spectrum are greatly decreased.

In accordance with the above feature of the optical device of the present invention, it becomes possible to present an optical device having low splitting losses, large signal to noise ratio, and a simplified device construction, thereby leading to significantly improved and stable production yield.

Optical signal splitting and insertion, delay line memory and delay equalization functions which are essential in optical information transmission and switching can all be provided by the same circuit configuration, thus presenting an optical device which is superior to the conventional optical devices of similar capability.

BRIEF DESCRIPTION OF THE DRAWINGS

FIG. 1 is a schematic drawing of the multi/demultiplexer of the arrayed waveguide grating type (AWGMD) having optical paths in the first embodiment.

FIG. 3 is the second embodiment of the multi/demultiplexer having the arrayed waveguide grating with loop-back optical paths.

PREFERRED EMBODIMENTS OF THE INVENTION

Figure 2A:
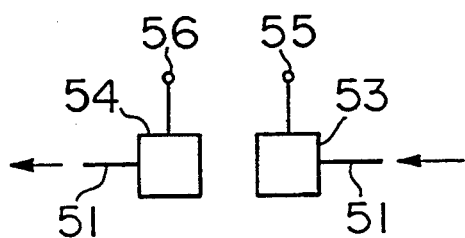
FIGS. 2(a) to 2(d) are schematic drawings of the examples of the signal processor in which 2(a) is an optical pulse regenerating circuit comprising Optical/Electrical converter, Electrical/Optical converter and waveform reshaping circuit; 2(b) is an optical amplifier; 2(c) is a signal processor having 2×2 switches; and 2(d) is an optical filter.
Figure 2B:
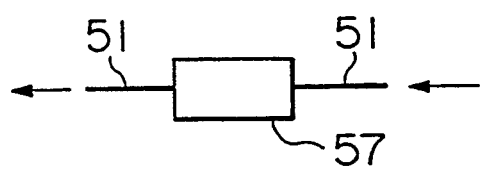

The preferred embodiments of the invention will be explained in the following with reference to the drawings.

First Embodiment

FIG. 1 is a schematic drawing to show the first embodiment of the arrayed waveguide grating (AWGMD) with loop-back optical paths.

The AWGMD with loop-back optical paths shown in this figure comprises: optical lines 6, 7; an AWGMD 41 disposed between the lines 6, 7; output waveguides 47; input waveguides 43; and optical fibers 51 to loop-back the optical signals outputted from the output waveguides 47 into the corresponding input waveguides 43; and respective signal processor 52 in each of the optical fibers 51.

In this embodiment, the optical line 6 is connected to an input waveguide 43$h$ which is one of the eight input waveguides 43$a$ to 43$h$; and the optical line 7 is connected to an output waveguide 47$h$ which is one of the eight output waveguides 47$a$ to 47$h$.

The seven wavelength-multiplexed optical signals of seven waveforms having the wavelengths $\lambda$, $\lambda 2$, ... $\lambda 7$ are inputted into the input waveguide 43$h$ of the AWGMD 41 after propagating through the optical line 6. The wavelength-multiplexed optical signals are diverged by the diffraction effects at the slab waveguide 44, and are guided into the various waveguides constituting the arrayed waveguide grating 46.

The optical signals are condensed by the slab waveguide 45 after propagating in the arrayed waveguide grating 46, but the nodes of the bundle of lights are different because of the phase differences generated during the propagation in the arrayed waveguide grating 46. In other words, the various wavelengths $\lambda i$ are taken out from the respective waveguides 47$j$ (where J=a, b, ... , g); for example, the wavelength $\lambda 1$ is outputted from the output waveguide 47$a$; the wavelength $\lambda 2$ from the output waveguide 47$b$, ... , and the wavelength $\lambda 7$ from the waveguide 47$g$. The optical signals are thus demultiplexed. The demultiplexed signals are propagated through the respective optical fibers 51$a$ to 51$g$, and are guided to the respective signal processors 52$a$ to 52$g$.

The signal processors 52 receive the optical signals, thereby obtaining the information transmitted. Each of the signal processors 52$a$ to 52$g$ is provided with a light source to generate an optical signal of the same wavelength as the received wavelength, and the information to be forwarded is superimposed on the optical signal, and is returned to the AWGMD 41 through the optical fibers 51.

The optical signal inputted into the input waveguide 43 is multiplexed by the same effect as that in the first propagation, in the output waveguide 47$h$. The important result in this operation is that the optical fiber 51$j$ of the jth fiber is connected to the input waveguide 43$j$ of the jth waveguide. The optical signal of the wavelength $\lambda i$ inputted from the input waveguide 43$j$ is outputted from the output waveguide 47$h$. That is to say that all the optical signal having the wavelengths $\lambda 1$, $\lambda 2$, ... , $\lambda 7$ are forwarded to the optical line 7 from the waveguide 47$h$.

In the meantime, the pilot optical signal of wavelength $\lambda 0$ does not pass through the optical fibers 51 and the signal processor 52, but is outputted through the input waveguide 43$h$, the arrayed waveguide grating 46 and the output waveguide 47$h$.

As described above, in the arrayed waveguide grating multi/demultiplexer (AWGMD) of the present invention, it is possible to perform multiplexing and demultiplexing operations using one AWGMD 41 by adopting an efficient loop-back configuration, i.e., looping the demultiplexed optical signal back to the input side with the use of the optical fibers 51.

In the first embodiment, a signal processor 52 is provided for each of the fibers 51 so as to be able to process all seven wavelengths. In general, however, it is not common to provide a signal processor for all the optical signals of the wavelength-multiplexed optical signals propagating in the optical line 6. In such a case, there is no need to provide a signal processor 52 in the optical fibers 51 in which is propagating an optical signal which does not need processing, and the signal processor 52 should be removed.

Next, the signal processor 52 will be explained in detail with reference to FIGS. 2($a$), 2($b$).

The signal processor shown in FIG. 2($a$) is an optical pulse regenerating circuit, and comprises: an optical/electrical (O/E) converter 53 consisting of a photodiode and its control circuits; an electrical/optical (E/O) converter 54 consisting of a semiconductor laser and its control circuits; a waveform reshaping circuit (not shown), disposed between the O/E converter 53 and the E/O converter 54, which reshapes the waveform degraded by propagation. This waveform reshaping circuit has a capability to regenerate the electrically degraded pulse signals into rectangular-pulses of the same bit rate.

The optical signals containing the desired information are converted into electrical signals by the O/E converter 53, and are outputted from the electrical output terminal 55. The information to be forwarded is inputted as electrical signals into the electrical input terminal 56 which are converted into optical signals by the E/O converter 54, and are outputted into optical fibers 51 (or into waveguide).

The signal processor shown in FIG. 2($b$) comprises a glass waveguide amplifier; an optical semiconductor amplifier, and an optical amplifier 57 such as erbium-doped optical fiber amplifier. These amplifiers regenerate the light intensity of optical signals degraded by propagating in the optical line 6 and the arrayed waveguide grating 46.

Figure 2C:
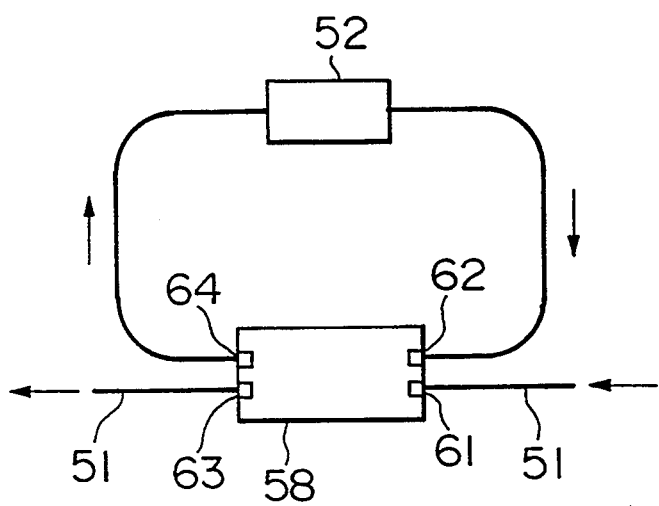

FIG. 2(c) is an example of using a 2×2 optical switch 58 to connect the signal processor 52 with the optical fibers 51.

The optical switch 58 comprises a 2×2 Mach-Zehnder interferometer made with a silica type glass, an optical semiconductors, or lithium niobate optical waveguide. The optical switch 58 has four input/output ports 61 to 64, and when the switch is in the through-state, port 61 is connected with port 63 and port 62 is connected with port 64, and the optical signals pass through without being processed. When the ports are cross-connected, port 61 is connected with port 64 and port 62 is connected with port 63, and the signal processing is performed.

Figure 2D:
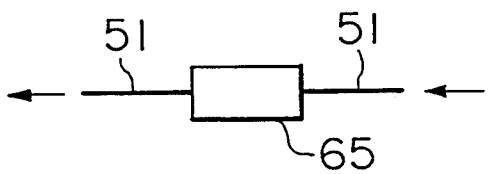
Figure 4:
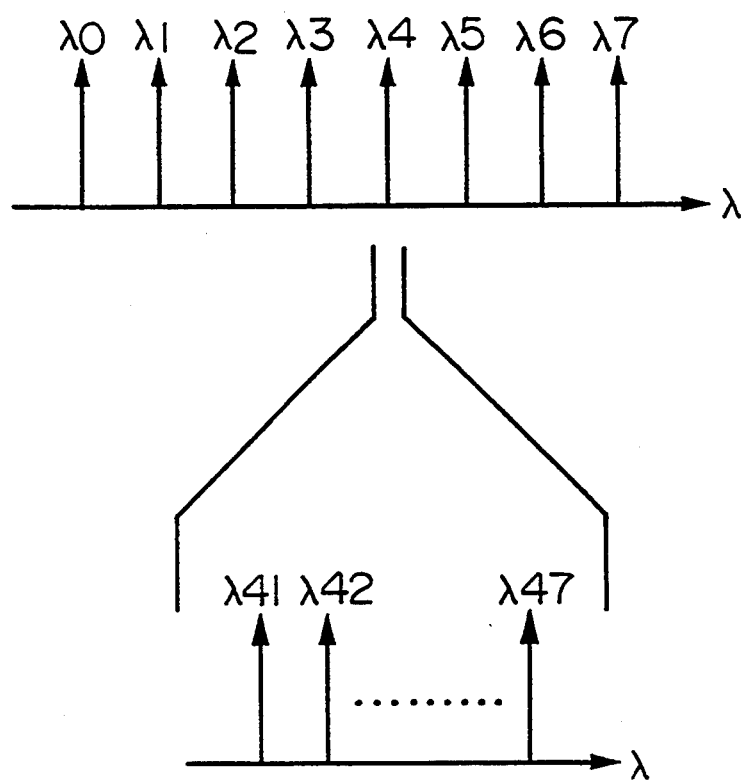
FIG. 4 is an illustration to explain the principle of performing further division operation on group multiplexed dense wavelength-division-multiplexed (WDM) optical signals.

The signal processor shown in FIG. 2(d) includes such devices as waveguide-type ring resonator having wavelength selectivity; waveguide-type Mach-Zehnder interferometer; and optical filters 65 using dielectric multilayer film (interference film). When an AWGMD of higher resolution capability is used, higher precision multiplexing and demultiplexing of optical signals become possible. With the use of such AWGMD, optical signal splitting and insertion of frequency-modulated optical signals become possible.

In the first embodiment, of the many input waveguides 43 and output waveguides 47, the terminal end input waveguide 43h is connected to optical line 6, and the terminal end output waveguide 47h is connected to the optical line 7, but the first embodiment is not limited only to such a configuration. For example, the same effect can be obtained by connecting input waveguide 43b with optical line 6, and output waveguide 47b with optical line 7. In general, the AWGMD 41 provides the highest diffraction efficiency and the lowest loss when the centrally positioned input waveguides 43 and the output waveguides 47 are utilized. Therefore, the optical line 6 should be connected to input waveguide 43d (or input waveguide 43e) which is close to the center, and the optical line 7 to output waveguide 47d (or output waveguide 47e) near the center.

Further, in this embodiment, the number of wavelength multiplexing by the AWGMD 41 is chosen to be eight, but the first embodiment is not limited to this number, and this number can be changed suitably by changing the design of the arrayed waveguide grating 46.

Further, signal processor 52 can be made of a 2×2 optical coupler. In this case, one of the two optical signals split into two optical signals by the optical coupler propagates through the optical fibers 51, and simultaneously, the other signal is outputted to an external receiver. It is thus possible to monitor propagated optical signals without severing the optical fibers 51. It is also possible to insert a new signal of the same wavelength in the optical fibers 51 with the use of the optical coupler.

Furthermore in the first embodiment, the polarization dependence can also be eliminated by depositing a layer of amorphous silicon on or inserting a λ/2 plate into the arrayed waveguide grating 46.

Embodiment 2

FIG. 3 is a schematic illustration of the second embodiment of the AWGMD with loop-back optical paths. The difference between the AWGMD with loop-back optical paths in the first and second embodiment is the provision of an optical fibers 51 between each output waveguides 47 and the input waveguides 43, and one optical fiber 51d of the optical fiber bundle, in which an optical signal having the wavelength λ4 is propagated, is provided with an AWGMD 41.

In this optical circuit, it is possible to further demultiplex the group demultiplexed dense wavelength-division multiplexed (dense WDM) optical signal λ4 (or frequency modulated optical signal) into wavelengths λ41, λ42, ..., λ47 (or a plurality of frequency modulated optical signals). It is also possible to multiplex a plurality of closely spaced wavelengths λ41, λ42, ..., λ47 (or a plurality of frequency-modulated optical signals) into dense WDM optical signals λ4 (or a frequency modulated optical signals).

According to the above AWGMD with loop-back optical paths, it is possible to perform further dense multiplexing or demultiplexing on previously modulated optical signals. It also enables splitting and inserting of dense WDM signals because of the two-staged splitting and inserting circuits provided.

Embodiment 3

Figure 5:
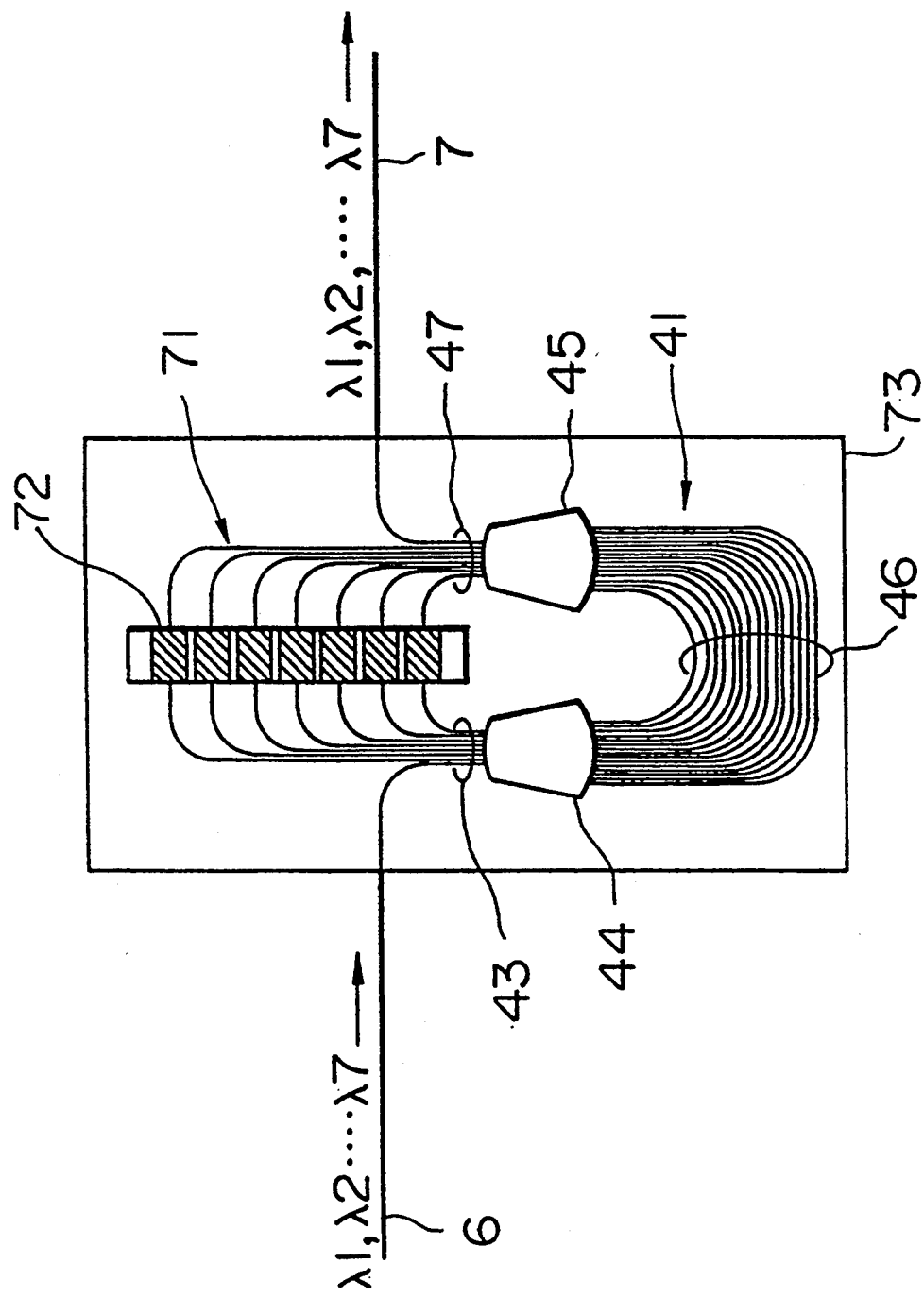
FIG. 5 is a schematic drawing of the third embodiment of the AWGMD with loop-back optical paths.

FIG. 5 is a schematic illustration of the third embodiment of the AWGMD with loop-back optical paths.

The feature of this AWGMD circuit is that the arrayed waveguide grating 41, a plurality of waveguides (loop-back optical paths) 71, and a plurality of signal processors 72 comprising optical semiconductors are all installed on one common substrate 73. The operation of and the signal flow of this circuit are the same as those in the first embodiment.

In this embodiment, because the input waveguides 43, the output waveguides 47 and the waveguide 71 are disposed on the same substrate 73, the labor of making connections is eliminated. Therefore, the number of component parts and the assembly steps are reduced, thus making the device further compact and increasing the device reliability.

Further, in this embodiment, the signal processor 72 made of optical semiconductor waveguides is integrated with the AWGMD 41 made of silica type glass. If the AWGMD 41 were made of optical semiconductor waveguides, it is possible to fabricate both devices at the same time on the same substrate 73, thus resulting in further savings in the manufacturing cost.

Also, although this AWGMD with the loop-back optical paths is fabricated by having all the devices on a common substrate, it is also possible to make the circuit by employing laser welding, optical bonding agents such as light hardening resins and soldering to bond the various component parts.

Embodiment 4

Figure 6:
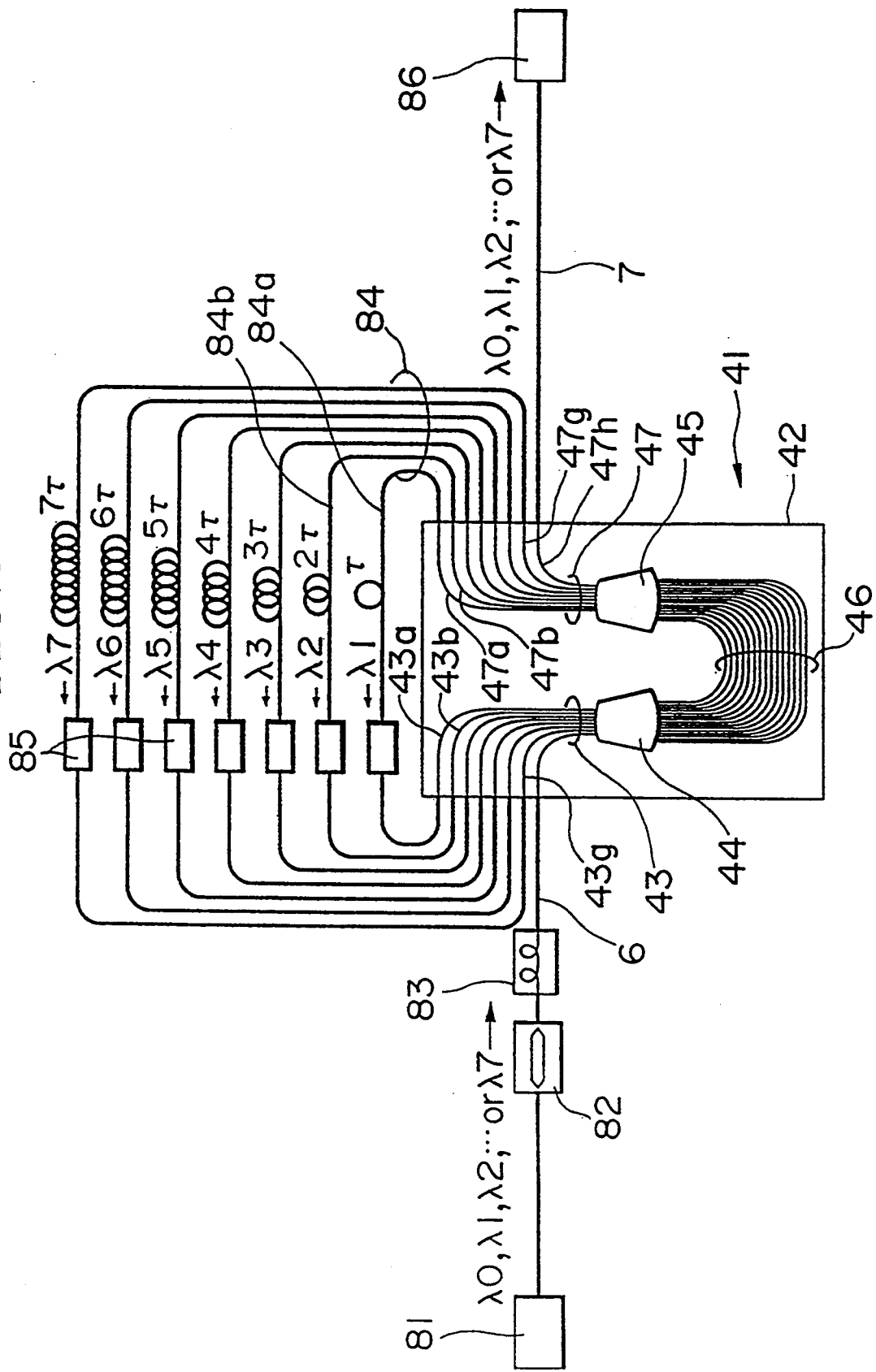
FIG. 6 is a schematic drawing of the forth embodiment of the AWGMD with loop-back optical paths.

FIG. 6 is a schematic illustration of the fourth embodiment of the AWGMD device with loop-back optical paths.

This device comprises: a wavelength-tunable semiconductor laser source 81; an intensity modulator (optical modulator) 82; a polarization compensator 83; an optical line 6 on the input side; a 7×7 AWGMD 41 made of silica glass; a plurality of delay line optical fibers (signal delay means) 84; a plurality of signal processors (optical signal processing means) 85; an optical line 7 on the output side; photodetector element 86.

The wavelength-tunable semiconductor laser source 81 is able to vary the wavelength of the output laser beam by changing the input current, for example. In this embodiment, a laser source 81 capable of generating seven wavelengths, λ1, λ2, ..., λ7 was used.

In the AWGMD 41, it is possible to output an optical signal of a specific wavelength, for example λi, generated from the laser source 81, and output it from the corresponding output waveguide 47j (j=a, b, ..., g) of the plurality of waveguides 47.

Also, the delay line optical fibers 84 are provided to correspond with the respective transmission waveguides between the output waveguides 47 and the input waveguides 43. For example, the first output waveguide (first o/w) 47a joins with the first delay line optical fiber 84a and the first input waveguide (i/w) 43a; second o/w 47b with second delay line optical fiber 84b and the second i/w 43b; and so on, so that signal light outputted from the output waveguides 47 will be given a certain delay time.

Next, the operation of the arrayed waveguide grating multi/demultiplexer (AWGMD) with loop-back optical paths will be presented.

The optical signal of the wavelength λi (i=1, 2, ..., 7) outputted from the wavelength-tunable laser source 81 is converted into respective optical signal having respective information by the signal processing operation of the intensity modulator 82. The signal is then passed through the polarization compensator 83 to coincide the polarization plane of the various signals, and, after passing through the optical line 6 on the input side, is inputted into the input waveguide 43a to 43g of the AWGMD 41. For example, the signal pulses inputted into the input waveguide (i/w) 43a are dispersed by diffraction at the slab waveguide 44, are inputted into a plurality of waveguides comprising the arrayed waveguide grating 46, and after passing through the grating 46, are condensed by the slab waveguide 45.

In this case, the location of interference of diffracted signal, i.e. the location of condensing light, is determined by the phase difference generated at the arrayed waveguide grating 46, and this location is wavelength-dependent. The signal light pulses of wavelength λi (i=1, 2, ..., 7) are outputted from the corresponding output waveguides 47j (o/w 47j) (j=a, b, ..., g): for example, λ1 is outputted from o/w 47a, λ2 from o/w 47b, ..., and λ7 from o/w 47g. Of these signal pulses, all excepting the pulse having the wavelength λ0, are returned to the input side and are inputted into the i/w 43j (j=a, b, ..., g) after having been given a time delay of iτ (i=1, 2, ..., 7) by passing through the delay line optical fibers 84j (j=a, b, ..., 7).

At this time, each of the optical signal pulses given delay times of iτ (i=1, 2, ..., 7) is outputted simultaneously with the optical signal pulse that has not been delayed to a common output waveguide 47h. The optical signal pulses pass through the optical line 7 on the output side, and are converted into electrical signals by the photodetector element 86, and thus constitute delayed information. In other words, the optical signal pulses of wavelengths λi inputted into the i/w 43j are forwarded to delay line fibers 84j via o/w 43j. In this case, if the wavelengths of the input optical signal pulses are changed to λ1, λ2, ..., λ7, the demultiplexed optical signal pulses can choose o/w 47j (j=a, b, ..., g), and the delay times of τ, 2τ, ..., 7τ in accordance with the delay line fibers 84.

As explained above, the AWGMD with loop-back optical paths comprises a wavelength-tunable semiconductor laser source 81; an intensity modulator (optical modulator) 82; a polarization compensator 83; an optical line 6 on the input side; a 7×7 AWGMD 41 made of silica glass; a plurality of delay line fibers (signal delay means) 84; a plurality of signal processors (optical signal processing means) 85; and an optical line 7 on the output side; a photodetector element 86. Therefore, it is possible to change the time delay of optical pulses freely and quickly.

Also, because the wavelength switching are performed using a wavelength-tunable semiconductor laser source 81, switching to selected wavelength can be performed readily. Also, because the variable delay times are produced by one AWGMD 41, it is possible to minimize the variations due to variables associated with a number of devices. The yield of the circuit is thus increased.

It is also possible to prevent an increase in the splitting loss with the increase in delay times.

Further, the light signal pulses are passed through the AWGMD 41 twice, through the delay line fibers 84, the bandwidth of the signal pulses becomes a narrowband, therefore, it becomes possible to significantly decrease the noise component of the optical signal spectrum.

Further in this embodiment, although a wavelength-tunable semiconductor laser source 81 was used as the variable wavelength light source, it is not limited to this device, and other light sources can be used. For example, distributed Bragg reflected (DBR) multi-electrode semiconductor laser, distributed feedback (DFB) semiconductor laser, Farby-Perot (FP) semiconductor laser, external cavity semiconductor laser may also be used to produce the same effect as the wavelength-tunable laser source 81 used in this embodiment.

Further for the wavelength-tunable laser source, it is also permissible to use a combination of N laser sources having a fixed but differing wavelengths with an N×1 optical coupler, a combination of N laser sources having a fixed but differing wavelengths with an optical gate switch and multiplexing with an N×1 optical coupler. In the former optical circuit, the wavelength can be changed by switching the N×1 optical coupler, and in the latter circuit, by turning on the optical gate switches.

Further, by changing the lengths of the delay line fibers, it is possible to change the duration and the range of the time delay.

Embodiment 5

Figure 7:
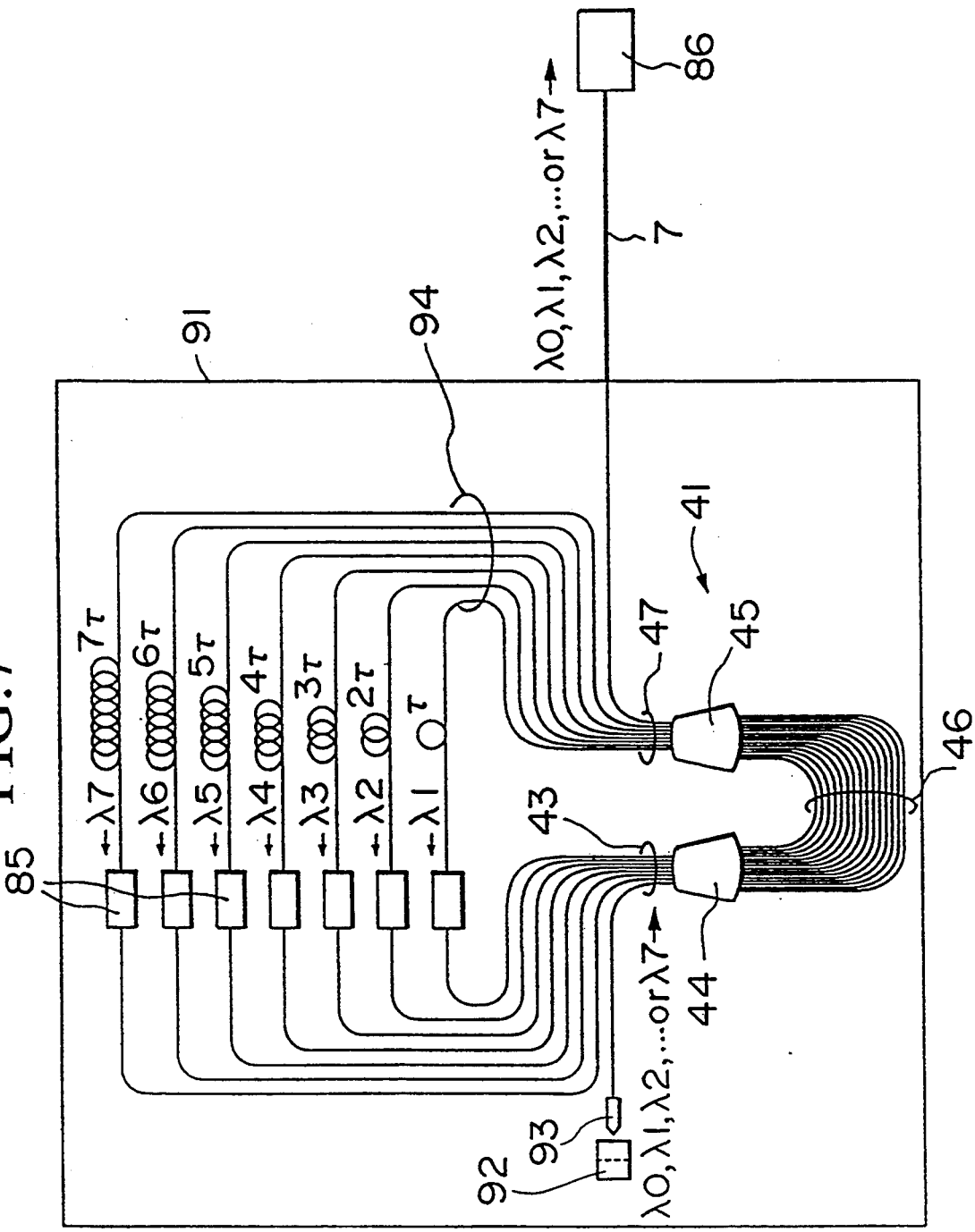
FIG. 7 is a schematic drawing of the fifth embodiment of the AWGMD with loop-back optical paths.

FIG. 7 is an illustration of the fifth embodiment the arrayed waveguide grating multi/demultiplexer (AWGMD) with loop-back optical paths.

The difference in the AWGMD devices between the fourth and the fifth embodiments is that the substrate 91 has the following devices integrally fabricated thereon; i.e. a wavelength-tunable semiconductor laser source 81 integrated with an intensity modulator 82 serving a wavelength-tunable optical transmitter 92 (wavelength-tunable light source, optical modulator); lensed fibers 93, an AWGMD 41; delay line waveguides (optical delay means) 94 replacing the delay line fibers 84; a plurality of optical signal processors 85.

In this embodiment, the two devices are connected with lensed fibers 93, because of the size difference between the optical transmitter 92 and the AWGMD 41, since it is difficult to connect them directly.

Further, the following fabricated devices may be used for the optical signal processor 85.

Figure 8:
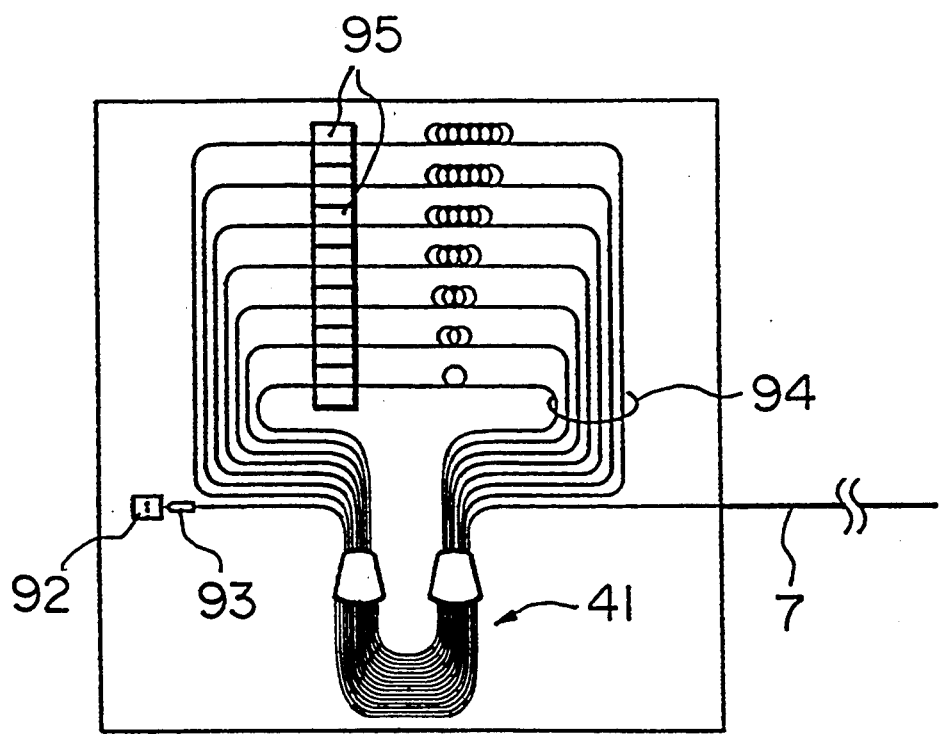
FIG. 8 is a schematic drawing showing the signal processor of the multi/demultiplexer of the fifth embodiment.

In FIG. 8, optical signal processor 85 is made by incorporating an optical amplifier 95 such as semiconductor amplifier or glass waveguide amplifier in the delay line waveguide 94, and this optical amplifier 95 compensates for the loss in signal intensity generated in the transmission paths and in the AWGMD 41.

Figure 9:
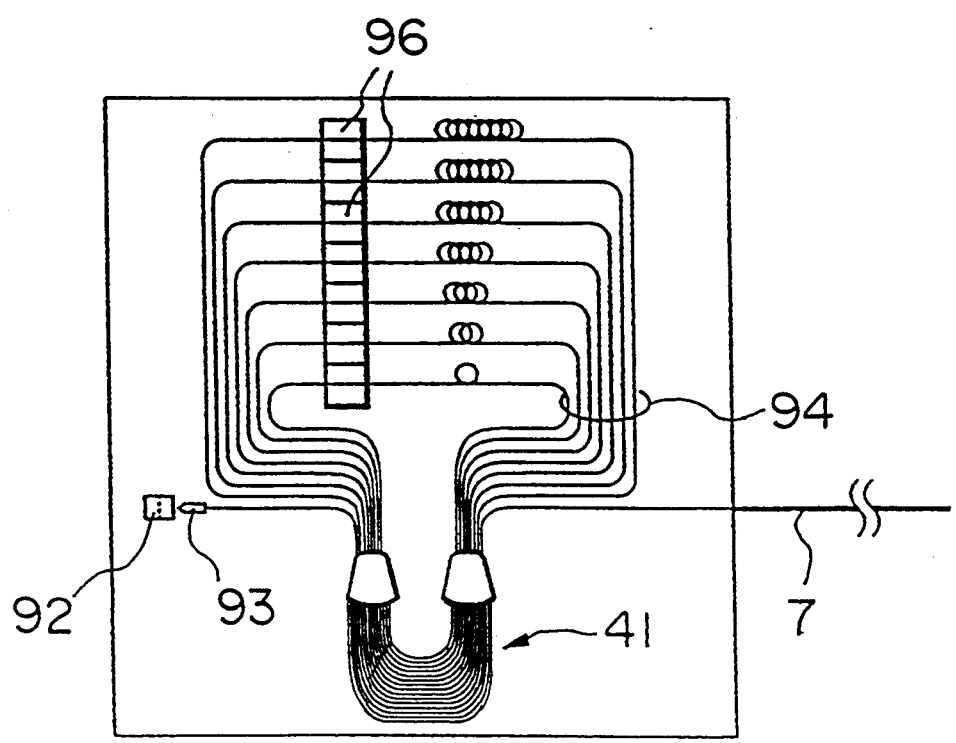
FIG. 9 is a schematic drawing of an example of an optical gate switch as the signal processor in the AWGMD with loop-back optical paths.

In FIG. 9, optical signal processor 85 is made by incorporating an optical gate switch 96, such as lithium niobate (LiNbO$_3$) optical modulator or a semiconductor switch in the delay line waveguide 94. These devices perform optical signal processing by passing or blocking a part of optical signal by turning on the optical gate switch 96 or the wavelength-tunable optical transmitter 92.

As explained above, the AWGMD of the present embodiment comprises an integrated circuit on a common substrate 91 including such devices as wavelength-tunable optical transmitter 92; lensed fiber 93; AWGMD 41; delay line waveguide 94; optical processors 85. Therefore, the circuit is able to provide the same functions as the AWGMD with loop-back optical paths presented in the embodiment 3. Also, the connections and the connecting steps required for connecting the laser source 81 with the intensity modulator 82 can be eliminated, and the polarization compensator 83 between the intensity modulator 82 and the AWGMD 41 can be eliminated. Therefore, the circuit can be made even more compact, and the number of parts required and the fabrication steps can be reduced.

Also, although this integration was made on a common substrate, it is also possible to make this circuit by employing laser welding, optical bonding agents such as light hardening resins and soldering to bond the various component parts.

Also in this embodiment, the wavelength-tunable optical transmitter 92 and the AWGMD 41 was connected with lensed fibers 93, other optical merging techniques can be utilized. For example, guided-wave spot size converter to effectively connect the two devices can be fabricated on the same substrate as the AWGMD 41 thereby further making the circuit more compact.

Embodiment 6

Figure 10:
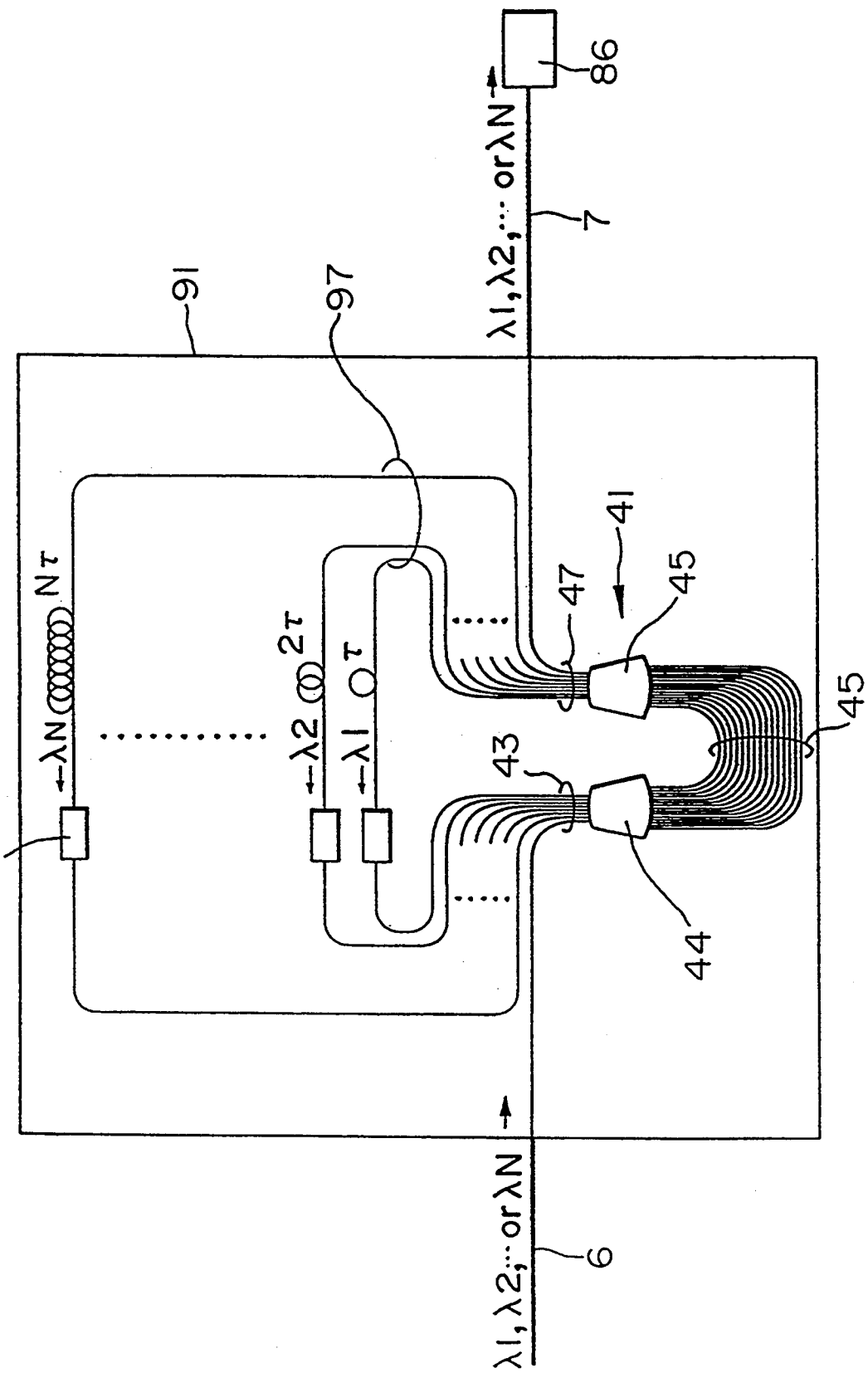
FIG. 10 is a schematic drawing showing the sixth embodiment of the AWGMD with loop-back optical paths.

FIG. 10 is an illustration of the sixth embodiment of the AWGMD with loop-back optical paths.

The differences in the AWGMD between this embodiment and the fifth embodiment are that, the lengths of the plurality of delay line waveguides (optical delay means) 97, which joins the input waveguides 43 and the output waveguides 47 on the same substrate 91, are made to be inversely proportional to the respective propagating wavelengths; and that the optical line 6 is connected to an external laser source.

In this circuit, the delay line waveguides 97 are made so that the length becomes longer the shorter the wavelength being propagated therein, therefore, it is possible to compress or separate the time-sequenced optical pulses arranged in the wavelength order on the time axis, or to arrange the optical pulses in the wavelength order, at a same time point, and to control their positions on the time axis. For example, optical pulse groups on the time axis can be compressed or separated.

The compression of an optical pulse group on the time axis will be explained in more detail.

Figure 11:
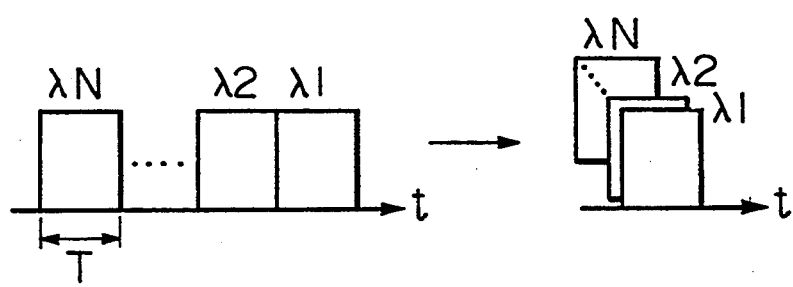
FIG. 11 is an illustration to explain the compression of the grouped time-arranged optical pulse signals.

In general, when the optical pulses propagate in optical fibers, the pulse width of the optical pulse tends to widen as a result of mode dispersion during the pulse transmission, or chirping in the semiconductor laser source. In this case, it is assumed that the wavelength components of the widened pulse are the same as those of the pulses multiplexed on the time axis. In other words, as shown in FIG. 11, the pulses for inputting are those short wavelength pulse group, $\lambda N, \ldots, \lambda 2, \lambda 1$, which propagate faster.

In the circuit of this embodiment, the lengths of the plurality of the delay line waveguides 97, through which the demultiplexed optical pulses pass, are adjusted so that the time interval T between the pulses is the same as the delay time $\tau$ between the neighboring delay line waveguides so that the long wavelength components propagate faster than the short wavelength components. The result is that the pulses having short wavelength components are delayed, and the expanded pulses on the time axis are compressed on a plurality of delay line waveguides 97 having the reverse delay properties.

Next, the separation of the time-sequenced pulse group will be explained.

Figure 12:
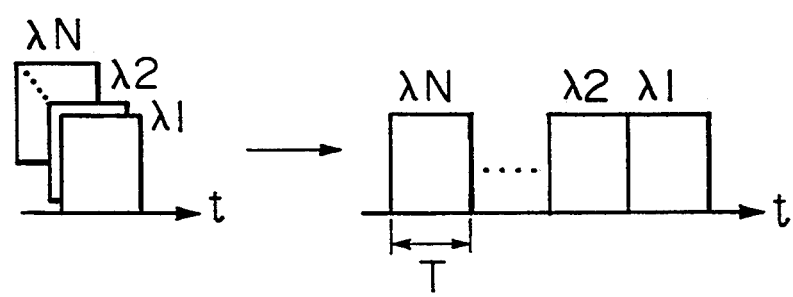
FIG. 12 is an illustration to explain the division of the grouped time-arranged optical pulse signals.

For example, a multi-wavelength generating semiconductor laser beam can be regarded as a synthesized beam comprising a number of simultaneously generated wavelengths, $\lambda 1, \lambda 2, \ldots$, and $\lambda N$. When this laser beam is externally multiplexed to produce simultaneously generated wavelengths $\lambda 1, \lambda 2, \ldots, \lambda N$, the short wavelength components propagate slower than the long wavelength components. Therefore, when the pulse group passes through the plurality of delay line waveguides, the component pulses distribute themselves on the time axis, as shown in FIG. 12. Thus, the simultaneously generated optical pulse group, comprising $\lambda N, \ldots, \lambda 2, \lambda 1$, can be separated on the time axis.

As explained above, the AWGMD with loop-back optical paths is fabricated so that the lengths of the plurality of delay line waveguides 97 joining the input waveguides 43 and the output waveguides 47, whose circuits are formed on the same substrate 94, are inversely proportional to the wavelengths being propagated therein. Therefore, the AWGMD of this embodiment enables to compress or separate the optical pulse group comprising pulses arranged in the order of wavelengths on the time axis.

Embodiment 7

Figure 13:
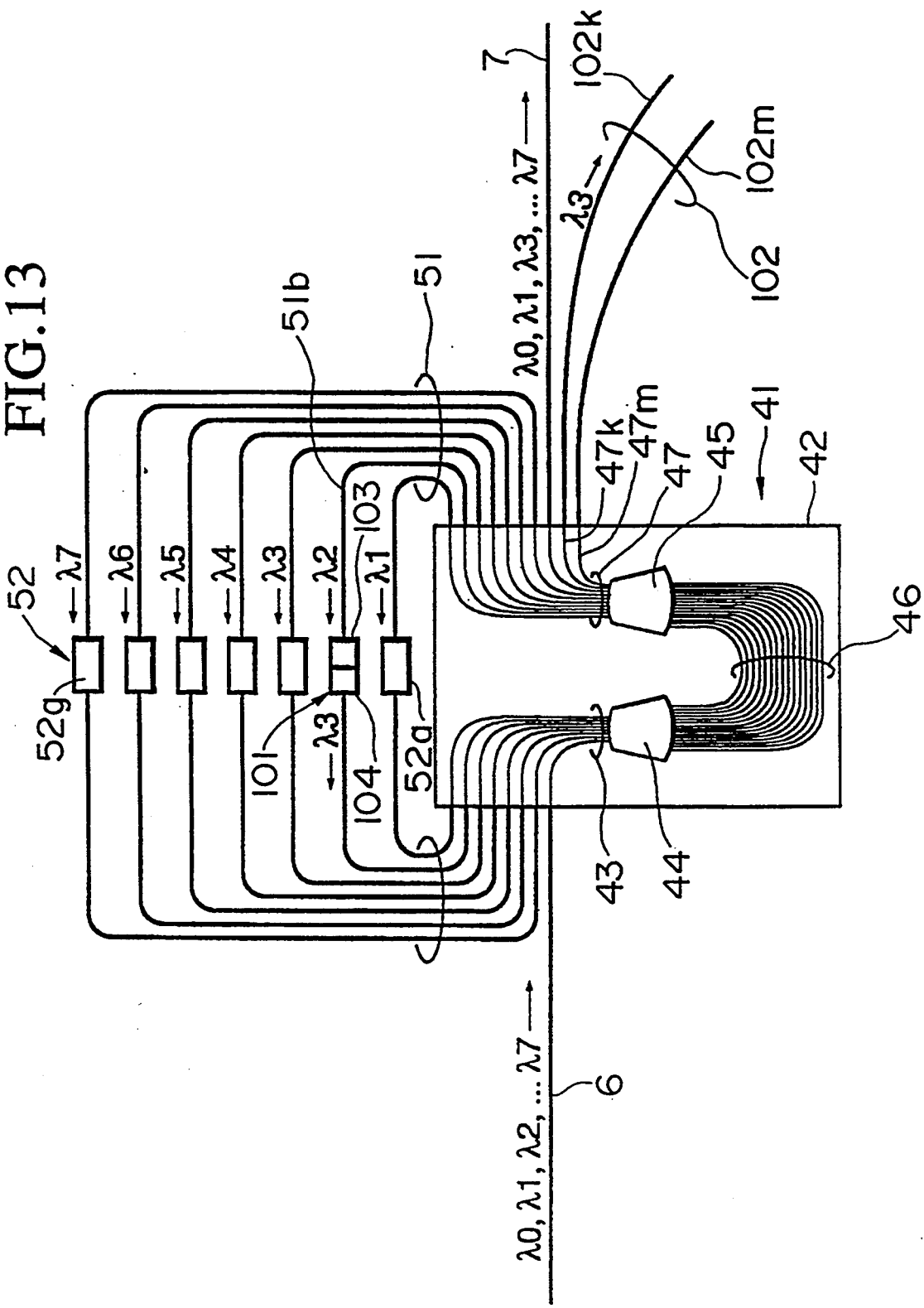
FIG. 13 is a schematic drawing showing the seventh embodiment of the AWGMD with loop-back optical paths.

FIG. 13 is an illustration of the seventh embodiment of the AWGMD with loop-back optical paths.

The difference between the AWGMD with loop-back optical paths of this embodiment and that in the first embodiment is that one signal processor 52b is served by a wavelength converter 101, and the slab waveguide 45 is provided with new output waveguides 47K, 47m, which are connected with new optical transmission lines 102k, 102m.

The wavelength converter 101 comprises: an O/E converter 103 to convert optical signal to electrical signal; and an E/O converter 104 which activates another laser source having another wavelength based on the electrical signal. However, other configurations are possible, for example converters utilizing nonlinear crystals such as potassium titanium phosphate (KTP), lithium niobate (LiNbO$_3$) lithium tantalate (LiTaO$_3$), or acousto-optic modulators (A/O modulator) based on crystalline materials such as molybdenum plumbate (PbMbO$_4$), tellurium dioxide (TeO$_2$).

In the AWGMD with loop-back optical paths, of the plurality of multiplexed optical signals propagated in the optical line 6 and inputted into input waveguide 43h, the optical signal converted by the wavelength converter 101 is not outputted from the optical line 7, but is outputted from another optical fiber 102 after propagating through the output waveguide 47. For example, if an optical signal demultiplexed into the optical fibers 51 having the wavelength λ2 is converted to a wavelength λ3, an optical signal having the wavelength λ3 can be forwarded to the optical fiber 102k through the output waveguide 47. Therefore, if the AWGMD with loop-back optical paths of the seventh embodiment is used as nodes in a ring network, it would be possible to exit the ring network and select an optical route to propagate to an external node or a terminal station.

Embodiment 8

Figure 14:
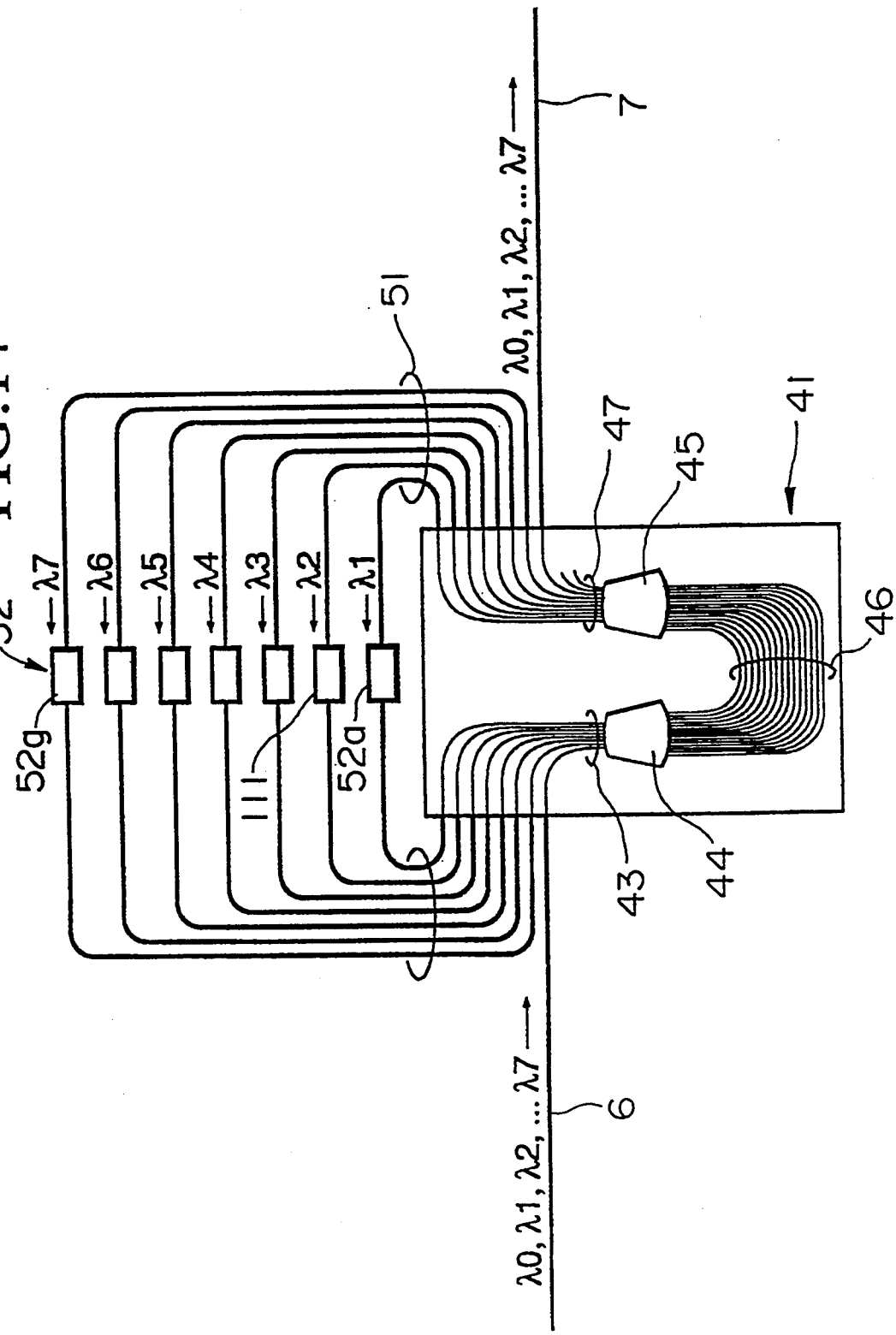
FIG. 14 is a schematic drawing showing the eighth embodiment of the AWGMD with loop-back optical paths.

FIG. 14 illustrates the eighth embodiment of the AWGMD with loop-back optical paths.

The difference between the eighth embodiment and the first embodiment is that one of the signal processor 52b includes an optical bistable device 111.

Figure 15:
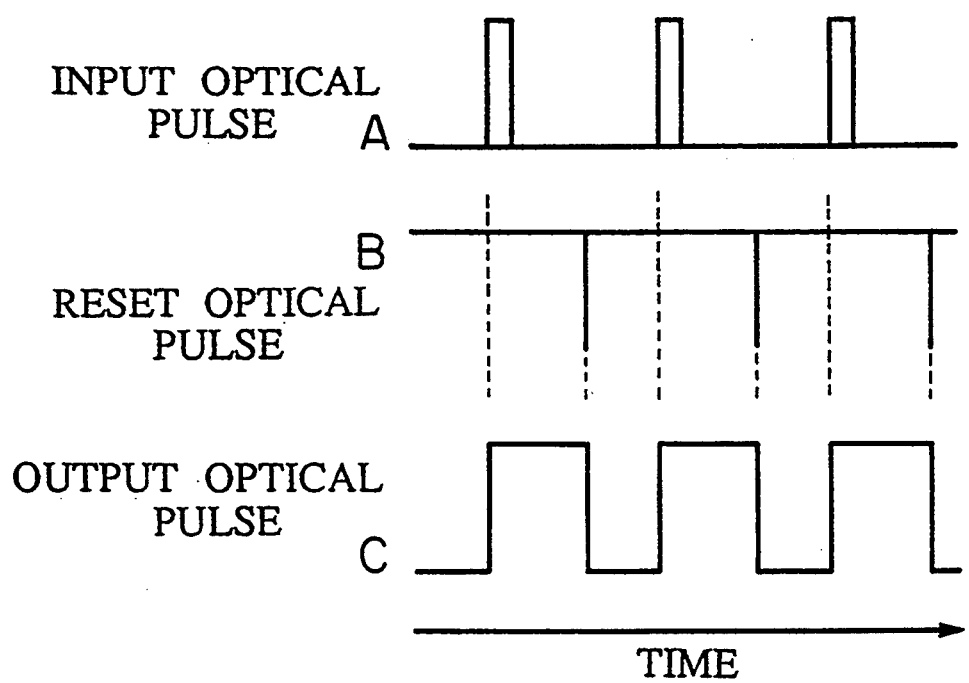
FIG. 15 shows various waveforms of optical pulses.

The optical bistable device 111 is an application of the non-linear optic effect of semiconductor lasers having a saturable absorption region. As shown in FIG. 15, when an optical pulse is inputted into an optical bistable device 111, the device 111 enters an oscillating state because of the non-linear optic effect. When an electrical reset pulse is impressed on the saturable absorption region, the device 111 changes to a non-oscillating state. Therefore, it enables to generate a new optical signal whose ON-period is between the input of a trigger optical pulse and the impression of an electrical reset signal. It is clear that the duration of the ON-period can be altered suitably.

Embodiment 9

Figure 16:
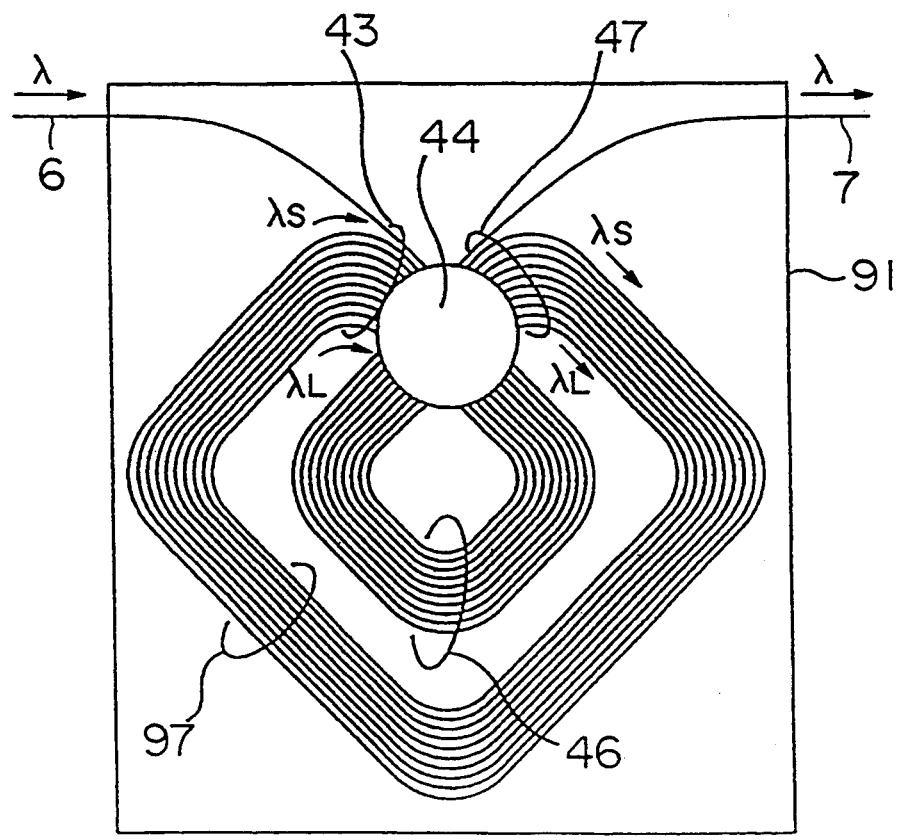
FIG. 16 is a schematic drawing showing the ninth embodiment of the AWGMD with loop-back optical paths.

FIG. 16 is an illustration of the ninth embodiment of the AWGMD with loop-back optical paths.

The difference between the ninth embodiment and the first embodiment is that one slab waveguide 44 is provided with the end terminals of the arrayed waveguide grating 46, the slab waveguide 44 is provided with the input waveguide 43 and the output waveguide 47, and the signal processors 85 are removed from the delay line waveguides.

In this circuit, the lengths of each of the waveguides of the delay line waveguides are chosen to be inversely related to the short wavelength components, λs. Therefore, the delay line waveguides 97 function as the normal dispersion medium having a larger dispersion coefficient than that of the zero-dispersion wavelength of the optical fiber having a dispersion shift wavelength of 1.3 μm.

For example, when an optical pulse having a wavelength of 1.55 μm propagates through an optical fiber having a 1.3 μm dispersion shift, the optical fiber functions as an anomalous dispersion medium, thus causing the shorter wavelength components, λs, to propagate faster than the longer wavelength components, λ1. Therefore, it means that the width of the propagating pulses expands.

When the expanded-width optical pulses are inputted from the optical line 6 into the AWGMD with loop-back optical paths of this embodiment, the closer the short wavelength components is to the leading edge of the optical pluses, the slower their propagation speeds. Similarly, the closer the long wavelength component is to the trailing edge of the optical pulses, the faster their propagation speeds. It follows that the delay line waveguide 97 acts as a normal dispersion medium having reverse dispersion properties, and is capable of narrowing the pulse width caused by wavelength dispersion, and in effect performs so-called dispersion compensation.

On the other hand, if the length of each of the waveguides of the delay line waveguides 97 is made to be proportional to the respective wavelength component of the optical signals, the delay line waveguides 97 can function as an anomalous dispersion medium. For example, it enables to compensate (equalize) pulse width broadening of optical pulses having a wavelength shorter than the zero-dispersion wavelength of a 1.3 μm dispersion shift optical fiber.

The dispersion compensation function of the delay line waveguides 97 is able to generate the same effect as presented above for optical pulses of any wavelengths to be transmitted by setting the delay times to correspond with the dispersion values.

Further, because the circuit uses only one slab waveguide 44, the entire AWGMD with loop-back optical paths can be made compact.

Embodiment 10

Figure 17:
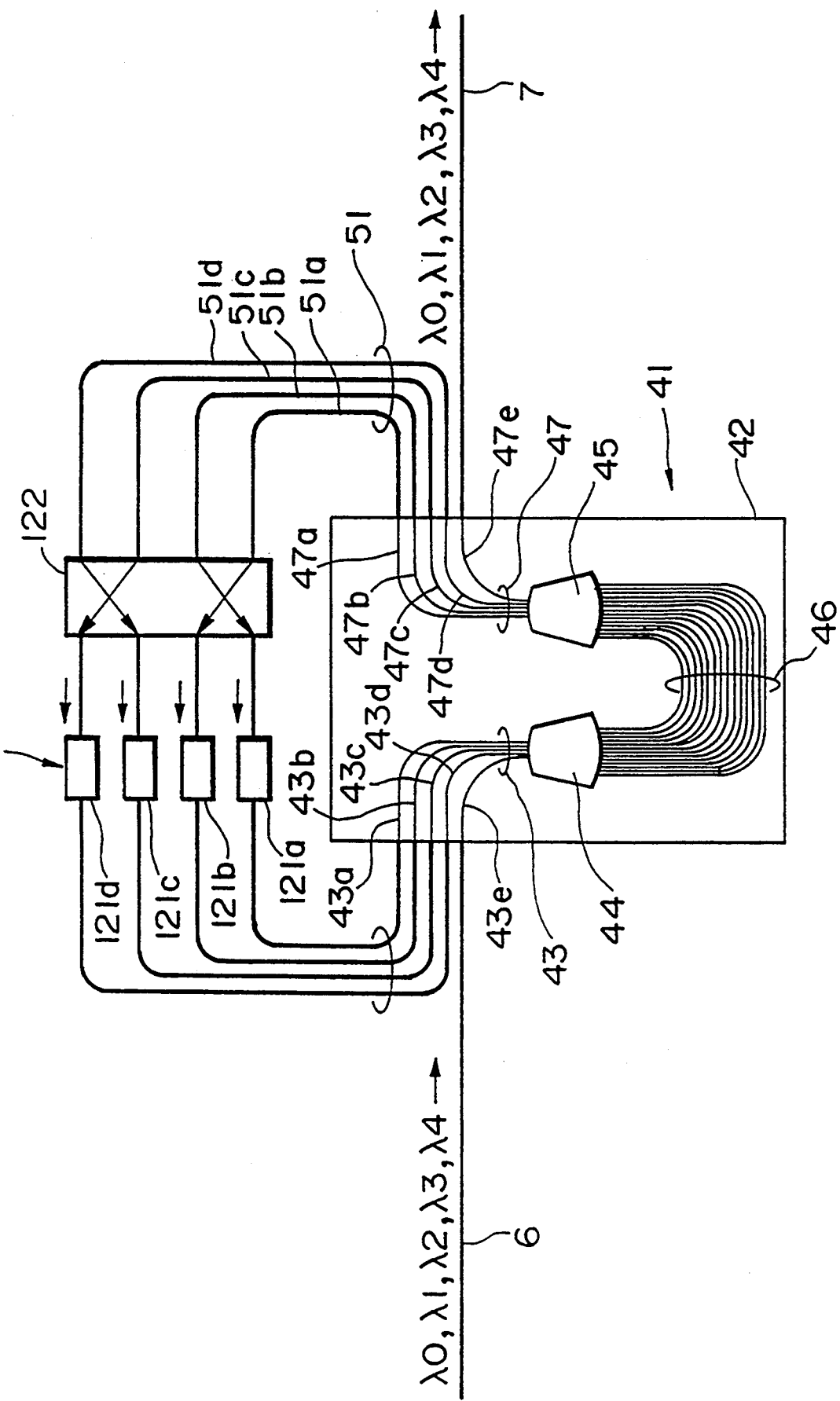
FIG. 17 is a schematic drawing showing the tenth embodiment of the AWGMD with loop-back optical paths.

FIG. 17 is an illustration of the tenth embodiment of the AWGMD with loop-back optical paths.

The difference between the tenth embodiment and the eighth embodiment is that optical fibers 51a to 51d are provided between each of the output waveguides 47 and the input waveguides 43, that each of the optical fibers 51a to 51d is provided with nodes 121a to 121d, and that a 4×4 optical matrix switch 122 is provided straddling the optical fibers 51a to 51d.

In the tenth embodiment, it is possible to select any optical path by operating the optical matrix switch 122 to switch the input waveguides 43a to 43d for returning a plurality of optical signals. In this embodiment, the waveguide 43e is used as the input terminal for the wavelength division multiplexing signal, and the output waveguide 47e is used as the output terminal, there are, in principle, $$(5-1)! = 4 \times 3 \times 2 \times 1 = 24$$

ways of selecting the optical paths.

Figure 18:
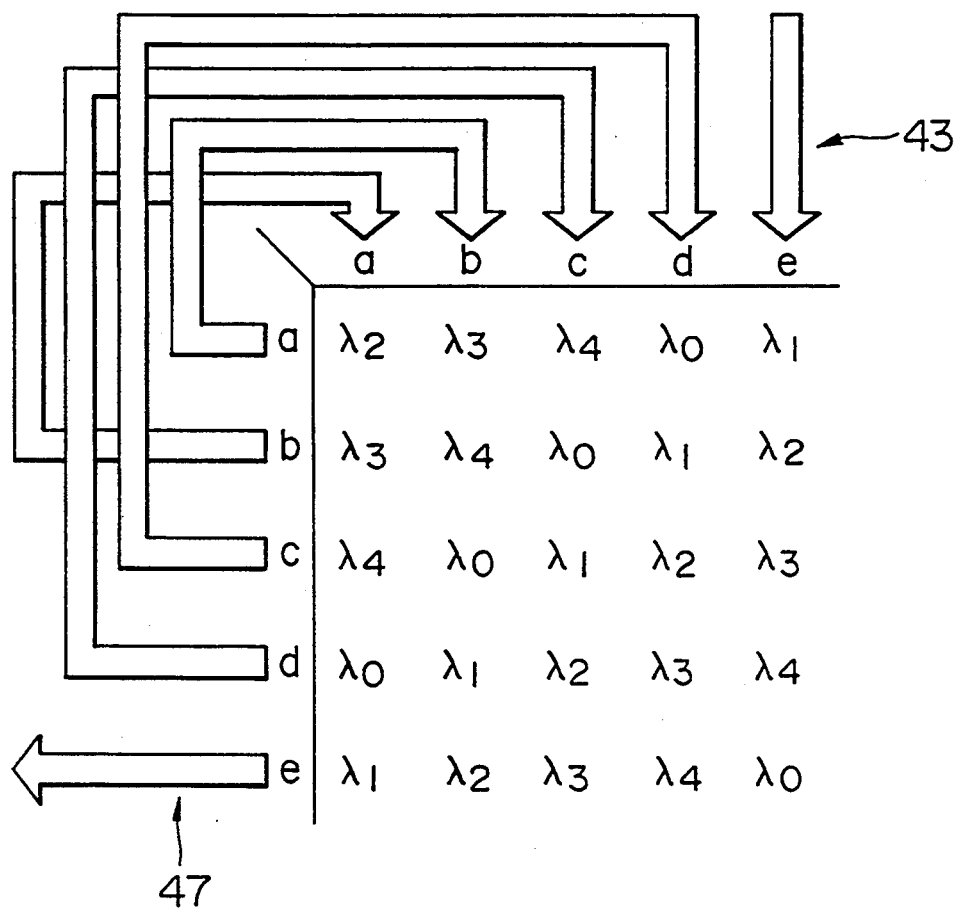
FIG. 18 is an illustration to show the state of input-/output of the optical signals in the tenth embodiment.
Figure 19:
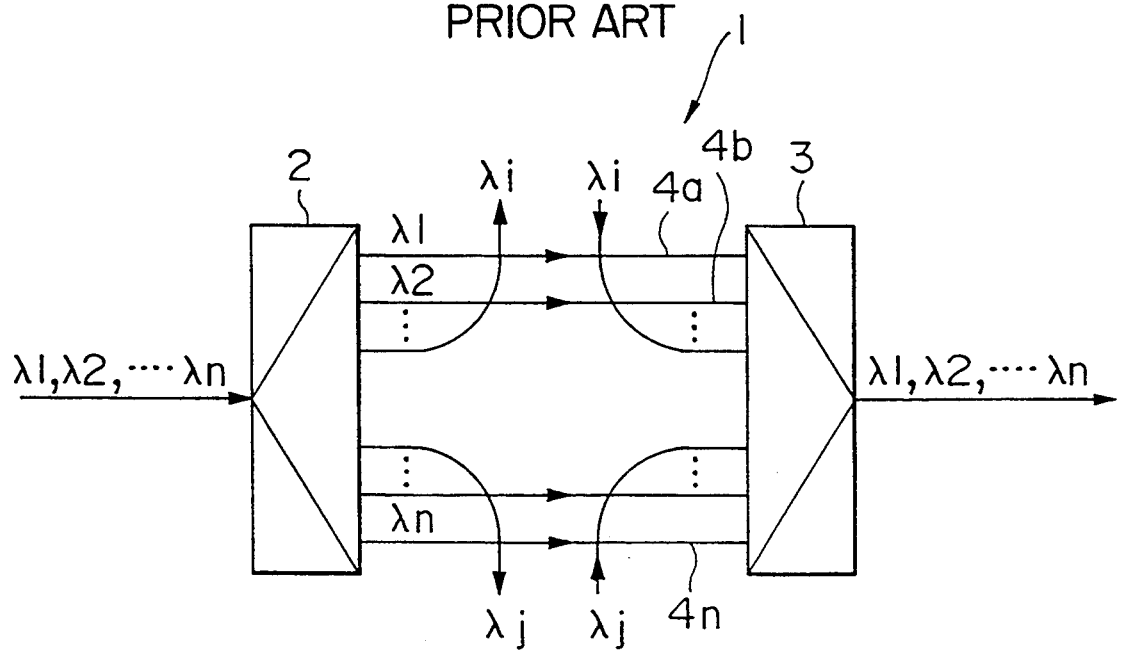
FIG. 19 is a schematic drawing of the conventional type of optical add-drop multiplexer (ADM).
Figure 20:
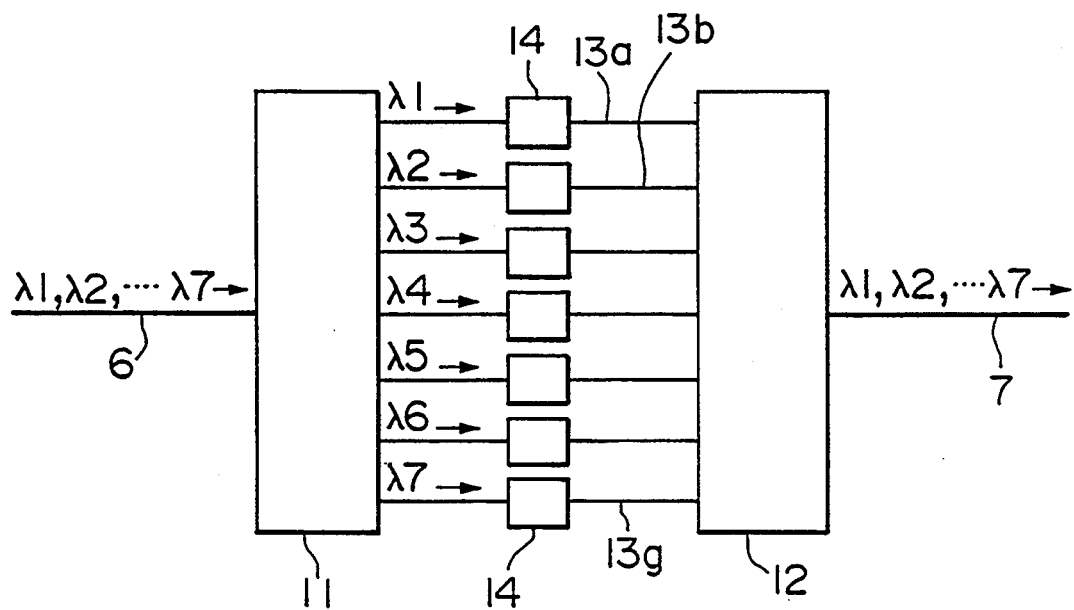
FIG. 20 is a schematic drawing of another conventional type of optical ADM.
Figure 21:
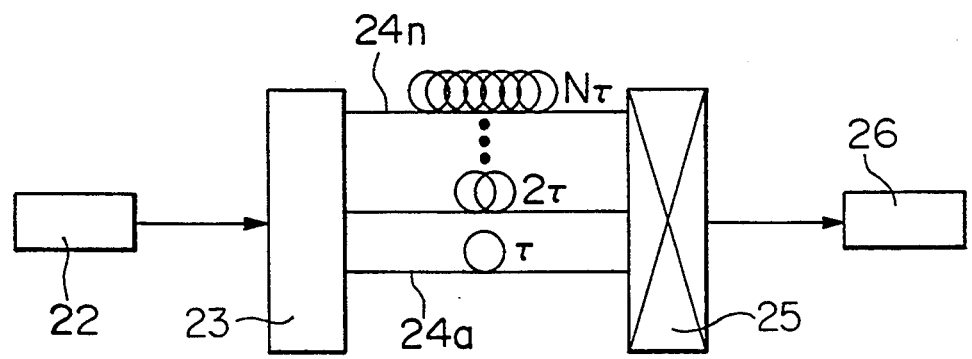
FIG. 21 is a schematic drawing of the conventional optical delay line memory of a parallel distribution type.
Figure 22:
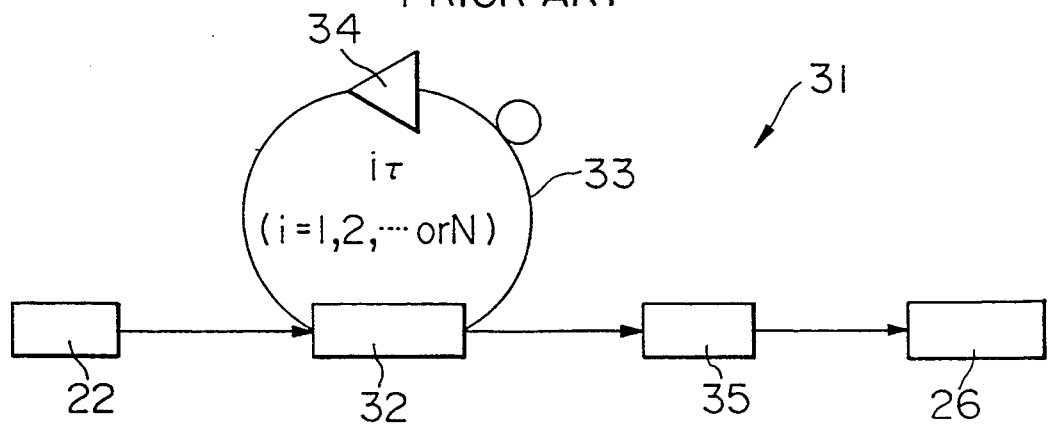
FIG. 22 is a schematic drawing of the conventional optical delay line memory of a circulating loop type.
Figure 23:
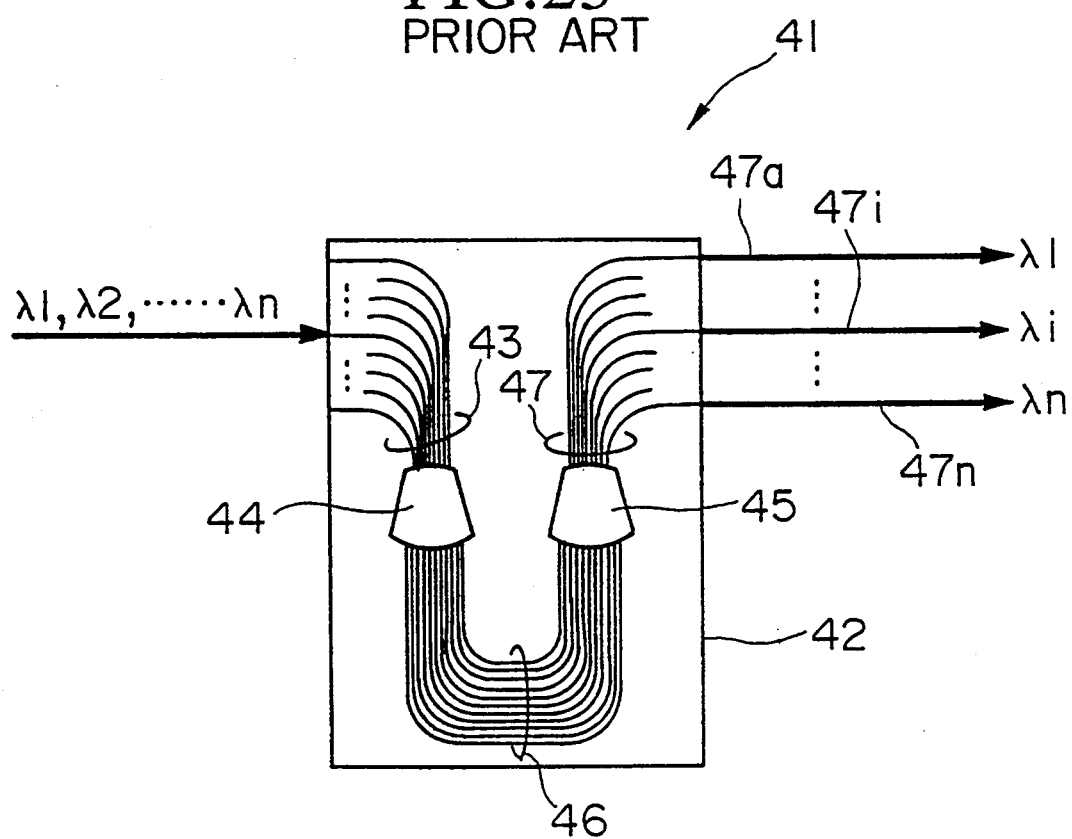
FIG. 23 is a schematic drawing of the conventional AWGMD.

The operation of the AWGMD with loop-back optical paths of the tenth embodiment will be explained below with reference to FIG. 18.

By operating the optical matrix switch 122, for example, the output waveguide (o/w) 47a is connected to the input waveguide (i/w) 43b; o/w 47b to i/w 43a; o/w 47c to i/w 43d; o/w 47d to i/w 43c, then an optical signal having the wavelength λ1 is outputted to optical transmission line 7 through the nodes 12b, 121c, 121d and 121a. Similarly, an optical signal having the wavelength λ2 passes through the nodes, 121a and 121b; an optical signal having the wavelength λ3 passes through the nodes, 121d, and 121c; an optical signal having the wavelength λ4 passes through the nodes 121c, 121b, 121a and 121d to be transmitted to optical line 7.

In this embodiment, each optical signal is outputted to the common optical line 7 after passing through more than one node 121a to 121d provided on the optical fiber bundle 51.

On the other hand, the pilot signal of λ0 does not pass through the optical matrix switch 122 and the nodes 121a to 121d, but it passes through input waveguides 43e, arrayed waveguide grating 46 and the output waveguide 47e, and is outputted to optical line 7.

As described above, by switching the optical matrix switch 122, it is possible to suitably switch the connections between the output waveguides 47a to 47d and the input waveguides 43a to 43d, and to select the nodes, 121a to 121d to be passed through. Further, even when using only one wavelength, by setting the optical path by switching the optical matrix switch 122, it is possible to select more than one suitable nodes of the nodes 121a to 121d to pass through. The order of passing through the nodes of the nodes 121 to 121d can also be suitably selected. Further, by operating the optical matrix switch 122 at high speed, the optical paths for passing the optical pulses shift with time, therefore, the optical matrix switch 122 can serve as a temporary optical memory for storing the optical cells or optical packets, which are groups of optical pulses, for certain specific interval of time.

What is claimed is:

1. An optical multiplexing/demultiplexing device, having loop-back paths constituted by a plurality of optical path means, for performing wavelength multiplexing and demultiplexing of an optical signal consisting of a plurality of wavelengths by separating said optical signal into individual wavelengths and propagating each wavelength separately in each of said optical path means, said device comprising:
   a. an arrayed waveguide grating multi/demultiplexer device, comprising an arrayed waveguide grating; a plurality of input sections for receiving said optical signals; a plurality of output sections for outputting optical signals; a slab waveguide for distributing or coupling wavelength signals optically disposed between said plurality of input sections and said waveguide grating, and another slab waveguide for distributing or coupling wavelength signal optically disposed between said plurality of output sections and said arrayed waveguide grating; and
   b. a plurality of loop-back optical path means for propagating and looping optical signals comprising said plurality of optical path means and having signal processing means disposed on selected ones of the optical path means;
   wherein said arrayed waveguide grating, a plurality of input sections, a plurality of output sections, and said slab waveguides are integrally fabricated on a common substrate base functioning as the arrayed waveguide grating multi/demultiplexer device, and said loop-back optical path means are optically connected with said plurality of input sections and with said plurality of output sections to propagate a wavelength signal from said plurality of output sections into at least one input section of said plurality of corresponding input sections to loop said wavelength signal at least once in one optical path means of said loop-back paths, thereby performing multiplexing and demultiplexing and signal time delay operations using said array waveguide grating multiplexer-demultiplexer device having loop-back paths.

2. The optical multiplexing/demultiplexing device as claimed in claim 1, wherein each of said plurality of loop-back optical paths means is provided with a signal processing means.

3. The optical multiplexing/demultiplexing device as claimed in claim 1, wherein a slab waveguide is disposed between said plurality of input sections and said plurality of output sections.

4. The optical multiplexing/demultiplexing device as claimed in claim 1, wherein said optical signals include a pilot optical signal which is not looped back into said loop-back optical paths means, and is inputted into said multi/demultiplexer having arrayed grating and is outputted from said output section.

5. The optical multiplexing/demultiplexing device as claimed in claim 1 wherein each of said plurality of loop-back optical paths means has a length proportional to the wavelength of an optical signal being propagated in an individual one of said plurality of loop-back optical paths means.

6. The optical multiplexing/demultiplexing device as claimed in claim 1, wherein each of said plurality of loop-back optical paths means has a length inversely proportional to the wavelength of an optical signal being propagated in an individual one of said plurality of loop-back optical paths means.

7. The optical multiplexing/demultiplexing device as claimed in claim 1, wherein at least one input section of said plurality of input section includes a light source selected from a group consisting of a wavelength-tunable light source, a multi-wavelength light source and a fixed-wavelength light source.

8. The optical multiplexing/demultiplexing device as claimed in claim 1, wherein at least one output section of said plurality of output section includes a photodetector means.

9. The optical multiplexing/demultiplexing device as claimed in claim 7, further comprising an optical modulator between each input section of said plurality of input sections and said wavelength-tunable light source.

10. The optical multiplexing/demultiplexing device as claimed in claim 7, further comprising a polarization compensator between one input section of said input sections and said wavelength-tunable light source.

11. The optical multiplexing/demultiplexing device as claimed in claim 1, wherein said optical device and said loop-back optical paths means are fabricated integrally.

12. The optical multiplexing/demultiplexing device as claimed in claim 1, wherein said optical device and said loop-back optical paths means are fabricated integrally on a common substrate base.

13. The optical multiplexing/demultiplexing device as claimed in claim 12, wherein each of said plurality of loop-back optical paths means includes signal processing means for processing an optical signal being propagated in said loop-back optical paths means.

14. The optical multiplexing/demultiplexing device as claimed in claim 13, wherein at least one of said signal processing means is selected from a group consisting of an optical amplifier, an optical switch means, an optical filter means, photodetector and light source means, and optical coupler means.

15. The optical multiplexing/demultiplexing device as claimed in claim 12, wherein each of said loop-back optical paths means has a length proportional to the wavelength of an optical signal being propagated in a respective one of said loop-back optical paths means.

16. The optical multiplexing/demultiplexing device as claimed in claim 12, wherein each of said loop-back optical paths means has a length inversely proportional to the wavelength of an optical signal being propagated in a respective one of said loop-back optical paths means.

17. The optical multiplexing/demultiplexing device as claimed in claim 12, wherein at least one input section of said plurality of input sections has a light source selected from a group consisting of a wavelength-tunable light source, a multi-wavelength light source and a fixed-wavelength light source.

18. The optical multiplexing/demultiplexing device as claimed in claim 17, further comprising an optical modulator between one input section of said plurality of input sections and said wavelength-tunable light source.

19. The optical multiplexing/demultiplexing device as claimed in claim 2, wherein at least one of said signal processing means is selected from a group consisting of an optical switch means, an optical merging/splitting circuit means, optical filter means and an optical coupler means.

20. The optical multiplexing/demultiplexing device as claimed in claim 19, wherein said optical switch means comprises an optical matrix switch disposed to straddle a plurality of said plurality of loop-back optical paths means, optically connecting an individual one of said plurality of loop-back optical paths means.

21. The optical multiplexing/demultiplexing device as claimed in claim 2, wherein at least one of said signal processing means is optical node means for transmitting, amplifying, splitting and merging optical signals.

22. The optical multiplexing/demultiplexing device as claimed in claim 2, wherein at least one of said signal processing means includes photodetector means and a light source.

23. The optical multiplexing/demultiplexing device as claimed in claim 2, wherein said signal processing means includes signal delay means.

24. The optical multiplexing/demultiplexing device as claimed in claim 2, wherein said signal processing means includes signal amplifier means.

25. The optical multiplexing/demultiplexing device as claimed in claim 2, wherein said signal processing means includes wavelength conversion means.

26. The optical multiplexing/demultiplexing device as claimed in claim 2, wherein said signal processing means includes an optical bistable device.

27. The optical multiplexing/demultiplexing device as claimed in claim 2, wherein said signal processing means includes optical pulse regenerating device means.

28. The optical multiplexing/demultiplexing device as claimed in claim 2, wherein said signal processing means includes optical pulse equalizing means.

29. The optical multiplexing/demultiplexing device as claimed in claim 2, wherein said signal processing means includes wavelength-selective optical filter means.

30. The optical multiplexing/demultiplexing device as claimed in claim 29, wherein said wavelength-selective optical filter means comprises an arrayed waveguide grating multi/demultiplexer.

31. The optical multiplexing/demultiplexing device as claimed in claim 29, wherein said wavelength-selective optical filter means comprises an interference film.

32. The optical multiplexing/demultiplexing device as claimed in claim 29, wherein said wavelength-selective optical filter means comprises a ring resonator.

33. The optical multiplexing/demultiplexing device as claimed in claim 29, wherein said wavelength-selective optical filter means comprises a Mach-Zehnder interferometer.

* * * * *